US012804811B2

(12) United States Patent
Kim

(10) Patent No.: US 12,804,811 B2
(45) Date of Patent: Nov. 17, 2026

(54) DISPLAY APPARATUS

(71) Applicant: SAMSUNG DISPLAY CO., LTD., Yongin-si (KR)

(72) Inventor: Junhyeon Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/051,841

(22) Filed: Feb. 12, 2025

(65) Prior Publication Data

US 2025/0380359 A1 Dec. 11, 2025

(30) Foreign Application Priority Data

Jun. 10, 2024 (KR) ........................ 10-2024-0075285

(51) Int. Cl.
*H05K 1/11* (2006.01)
*H05K 1/189* (2026.01)

(52) U.S. Cl.
CPC ............. *H05K 1/111* (2013.01); *H05K 1/189* (2013.01); *H05K 2201/09418* (2013.01); *H05K 2201/10128* (2013.01); *H05K 2201/10689* (2013.01)

(58) Field of Classification Search
CPC ................... H05K 1/111; H05K 1/189; H05K 2201/09418; H05K 2201/10128; H05K 2201/10689; H05K 1/118; H05K 1/147; H05K 3/323; H05K 3/361; H05K 1/0268; G01R 31/2843; G01R 31/2808; G01R 31/2825; G01R 31/2844; G01R 31/2853; G01R 31/2879; G09G 3/2096; H10H 29/142; H10W 90/00
See application file for complete search history.

(56) References Cited

U.S. PATENT DOCUMENTS 9,679,507 B2 6/2017 Shin
10,546,909 B2 * 1/2020 Lee ........................ G09G 3/006
11,487,176 B2 * 11/2022 Fujikawa ............... G09G 3/006
11,545,075 B2 * 1/2023 Lin ...................... G09G 3/3225
(Continued)

FOREIGN PATENT DOCUMENTS

KR 10-2007-0053406 A 5/2007
KR 10-2015-0112106 A 10/2015
(Continued)

*Primary Examiner* — Xanthia C Relford
(74) *Attorney, Agent, or Firm* — F. CHAU & ASSOCIATES, LLC

(57) ABSTRACT

A display apparatus includes a display panel including a plurality of printed circuit board (PCB) input pad units and a plurality of integrated circuit (IC) input pad units, a printed circuit board including a plurality of PCB output pad units and a measurement terminal unit, and a plurality of integrated circuit chips respectively connected to the plurality of IC input pad units. The measurement terminal unit includes a plurality of measurement terminals arranged adjacent to each other. Each of the plurality of integrated circuit chips includes a plurality of IC output pads. Each of the plurality of PCB output pads units includes a plurality of PCB output pads electrically connected to the plurality of IC output pads. At least some of the plurality of PCB output pads electrically connected to the plurality of IC output pads are electrically connected to the plurality of measurement terminals.

24 Claims, 12 Drawing Sheets

(56) References Cited

U.S. PATENT DOCUMENTS

| | | | | |
|---|---|---|---|---|
| 11,930,675 | B2 * | 3/2024 | Chen | G02F 1/13336 |
| 2004/0108977 | A1 * | 6/2004 | Hirayama | G09G 3/20<br>345/76 |
| 2014/0253158 | A1 | 9/2014 | Ko et al. | |
| 2017/0164478 | A1 * | 6/2017 | Lee | G02F 1/13458 |
| 2017/0261542 | A1 * | 9/2017 | Onishi | G01R 27/02 |
| 2019/0392741 | A1 * | 12/2019 | Cho | G09G 3/006 |
| 2020/0020272 | A1 * | 1/2020 | Huang | G02F 1/13452 |
| 2020/0303270 | A1 * | 9/2020 | Lim | H05K 1/0268 |
| 2021/0074622 | A1 * | 3/2021 | Koo | H05K 1/0268 |

FOREIGN PATENT DOCUMENTS

| | | | |
|---|---|---|---|
| KR | 10-2018-0110710 | A | 10/2018 |
| KR | 10-2038102 | B1 | 10/2019 |

* cited by examiner

DISPLAY APPARATUS

CROSS-REFERENCE TO RELATED APPLICATION

This application claims priority under 35 U.S.C. § 119 to Korean Patent Application No. 10-2024-0075285, filed on Jun. 10, 2024 in the Korean Intellectual Property Office, the present disclosure of which is incorporated by reference in its entirety herein.

TECHNICAL FIELD

One or more embodiments relate to a display apparatus, and more particularly, to a display apparatus that may easily check a bonding state between a flexible printed circuit board and a display panel and a bonding state between an integrated circuit chip and the display panel.

DISCUSSION OF RELATED ART

A display apparatus may include a flexible printed circuit board, a printed circuit board, and an integrated circuit chip. The printed circuit board may be electrically connected to a display panel through the flexible printed circuit board. The integrated circuit chip may be directly electrically connected to the display panel.

To this end, a pad included in the flexible printed circuit board and a pad included in the display panel may be adhered to each other. Further, a pad included in the flexible printed circuit board and a pad included in the printed circuit board may be adhered to each other. Additionally, a pad included in the integrated circuit chip and a pad included in the display panel may be adhered to each other. As a size of a pad decreases and a pitch decreases due to an increased resolution of a display apparatus, the locations of the flexible printed circuit board, an integrated circuit chip, and a display panel should be adjusted so that they may be sufficiently adhered. A bonding quality between the flexible printed circuit board and the display panel and bonding quality between the integrated circuit chip and the display panel may have a significant influence on whether an electrical signal is accurately transmitted to the display panel. Accordingly, the bonding quality between the flexible printed circuit board and the display panel and the bonding quality between the integrated circuit chip and the display panel may be tested during the manufacturing process for the display apparatus. However, a conventional display apparatus may not efficiently test bonding quality between a flexible printed circuit board and a display panel and bonding quality between an integrated circuit chip and the display panel.

SUMMARY

One or more embodiments include a display apparatus that may easily check a bonding state between a flexible printed circuit board and a display panel and a bonding state between an integrated circuit chip and the display panel. However, these embodiments are examples and the scope of embodiments of the present disclosure are not limited thereto.

Additional aspects will be set forth in part in the description which follows and, in part, will be apparent from the description, or may be learned by practice of the presented embodiments.

According to an embodiment of the present disclosure, a display apparatus includes a display panel including a plurality of printed circuit board (PCB) input pad units and a plurality of integrated circuit (IC) input pad units, a printed circuit board including a plurality of PCB output pad units and a measurement terminal unit, and a plurality of integrated circuit chips respectively connected to the plurality of IC input pad units. The measurement terminal unit includes a plurality of measurement terminals arranged adjacent to each other. Each of the plurality of integrated circuit chips includes a plurality of IC output pads. Each of the plurality of PCB output pad units includes a plurality of PCB output pads electrically connected to the plurality of IC output pads. At least some of the plurality of PCB output pads electrically connected to the plurality of IC output pads are electrically connected to the plurality of measurement terminals.

In an embodiment, the plurality of PCB output pad units may include a first PCB output pad unit and a second PCB output pad unit. In a plan view, the first PCB output pad unit may be disposed adjacent to a first side of the display panel, and in the plan view, the second PCB output pad unit may be disposed adjacent to a second side facing the first side of the display panel. The first PCB output pad unit may include a 1-1 PCB output pad group and a 2-1 PCB output pad group, and the second PCB output pad unit may include a 1-2 PCB output pad group and a 2-2 PCB output pad group. In the plan view, the 1-1 PCB output pad group may be disposed closer to the first side of the display panel than the 2-1 PCB output pad group, and in the plan view, the 1-2 PCB output pad group may be disposed closer to the first side of the display panel than the 2-2 PCB output pad group. The measurement terminal unit may include a first measurement terminal group and a second measurement terminal group. Each of the first measurement terminal group and the second measurement terminal group may include a plurality of measurement terminals arranged adjacent to each other. PCB output pads of the 1-1 PCB output pad group electrically connected to the IC output pads may be electrically connected to a first portion of the plurality of measurement terminals of the first measurement terminal group. PCB output pads of the 2-2 PCB output pad group electrically connected to the IC output pads may be electrically connected to a first portion of the plurality of measurement terminals of the second measurement terminal group.

In an embodiment, PCB output pads of the 2-1 PCB output pad group electrically connected to the IC output pads may be electrically connected to a second portion of the plurality of measurement terminals of the first measurement terminal group. PCB output pads of the 1-2 PCB output pad group electrically connected to the IC output pads may be electrically connected to a second portion of the plurality of measurement terminals of the second measurement terminal group.

In an embodiment, the plurality of PCB output pad units may further include a third PCB output pad unit disposed between the first PCB output pad unit and the second PCB output pad unit. The third PCB output pad unit includes a 1-3 PCB output pad group and a 2-3 PCB output pad group. In the plan view, the 1-3 PCB output pad group is disposed closer to the first side of the display panel than the 2-3 PCB output pad group.

In an embodiment, PCB output pads of the 2-1 PCB output pad group electrically connected to the IC output pads may be electrically connected to a second portion of the plurality of measurement terminals of the first measurement terminal group. PCB output pads of the 1-3 PCB output pad group electrically connected to the IC output pads may be electrically connected to a third portion of the plurality of measurement terminals of the first measurement terminal group. PCB output pads of the 2-3 PCB output pad group electrically connected to the IC output pads may be electrically connected to a third portion of the plurality of measurement terminals of the second measurement terminal group. PCB output pads of the 1-2 PCB output pad group electrically connected to the IC output pads may be electrically connected to a second portion of the plurality of measurement terminals of the second measurement terminal group.

In an embodiment, the plurality of PCB output pad units may further include a fourth PCB output pad unit located between the first PCB output pad unit and the third PCB output pad unit, and a fifth PCB output pad unit located between the second PCB output pad unit and the third PCB output pad unit. The fourth PCB output pad unit includes a 1-4 PCB output pad group and a 2-4 PCB output pad group. The fifth PCB output pad unit includes a 1-5 PCB output pad group and a 2-5 PCB output pad group. In the plan view, the 1-4 PCB output pad group is disposed closer to the first side of the display panel than the 2-4 PCB output pad group, and in the plan view, the 1-5 PCB output pad group is disposed closer to the first side of the display panel than the 2-5 PCB output pad group.

In an embodiment, PCB output pads of the 2-4 PCB output pad group electrically connected to the IC output pads may be electrically connected to a fourth portion of the plurality of measurement terminals of the first measurement terminal group. PCB output pads of the 1-3 PCB output pad group electrically connected to the IC output pads may be electrically connected to a third portion of the plurality of measurement terminals of the first measurement terminal group. PCB output pads of the 2-3 PCB output pad group electrically connected to the IC output pads may be electrically connected to a third portion of the plurality of measurement terminals of the second measurement terminal group. PCB output pads of the 1-5 PCB output pad group electrically connected to the IC output pads may be electrically connected to a fifth portion of the plurality of measurement terminals of the second measurement terminal group.

In an embodiment, PCB output pads of the 2-1 PCB output pad group electrically connected to the IC output pads may not be electrically connected to the plurality of measurement terminals of the measurement terminal unit. PCB output pads of the 1-4 PCB output pad group electrically connected to the IC output pads may not be electrically connected to the plurality of measurement terminals of the measurement terminal unit. PCB output pads of the 2-5 PCB output pad group electrically connected to the IC output pads may not be electrically connected to the plurality of measurement terminals of the measurement terminal unit. PCB output pads of the 1-2 PCB output pad group electrically connected to the IC output pads may not be electrically connected to the plurality of measurement terminals of the measurement terminal unit.

In an embodiment, the third PCB output pad unit may include a 3-1 PCB output pad unit disposed adjacent to the first PCB output pad unit and a 3-2 PCB output pad unit disposed adjacent to the second PCB output pad unit. The 3-1 PCB output pad unit includes a 1-3-1 PCB output pad group and a 2-3-1 PCB output pad group. The 3-2 PCB output pad unit includes a 1-3-2 PCB output pad group and a 2-3-2 PCB output pad group. In the plan view, the 1-3-1 PCB output pad group is disposed closer to the first side of the display panel than the 2-3-1 PCB output pad group. In the plan view, the 1-3-2 PCB output pad group is disposed closer to the first side of the display panel than the 2-3-2 PCB output pad group.

In an embodiment, PCB output pads of the 1-3-1 PCB output pad group electrically connected to the IC output pads may be electrically connected to a third portion of the plurality of measurement terminals of the first measurement terminal group. PCB output pads of the 2-3-2 PCB output pad group electrically connected to the IC output pads may be electrically connected to a third portion of the plurality of measurement terminals of the second measurement terminal group.

In an embodiment, PCB output pads of the 2-3-1 PCB output pad group electrically connected to the IC output pads may not be electrically connected to the plurality of measurement terminals of the measurement terminal unit. PCB output pads of the 1-3-2 PCB output pad group electrically connected to the IC output pads may not be electrically connected to the plurality of measurement terminals of the measurement terminal unit.

In an embodiment, the plurality of PCB output pad units may further include a fourth PCB output pad unit disposed between the first PCB output pad unit and the third PCB output pad unit, and a fifth PCB output pad unit disposed between the second PCB output pad unit and the third PCB output pad unit. The fourth PCB output pad unit includes a 1-4 PCB output pad group and a 2-4 PCB output pad group. The fifth PCB output pad unit includes a 1-5 PCB output pad group and a 2-5 PCB output pad group. In the plan view, the 1-4 PCB output pad group is disposed closer to the first side of the display panel than the 2-4 PCB output pad group. In the plan view, the 1-5 PCB output pad group is disposed closer to the first side of the display panel than the 2-5 PCB output pad group.

In an embodiment, PCB output pads of the 2-4 PCB output pad group electrically connected to the IC output pads may be electrically connected to a fourth portion of the plurality of measurement terminals of the first measurement terminal group. PCB output pads of the 1-5 PCB output pad group electrically connected to the IC output pads may be electrically connected to a fifth portion of the plurality of measurement terminals of the second measurement terminal group.

In an embodiment, PCB output pads of the 2-1 PCB output pad group electrically connected to the IC output pads may not be electrically connected to the plurality of measurement terminals of the measurement terminal unit. PCB output pads of the 1-4 PCB output pad group electrically connected to the IC output pad may not be electrically connected to the plurality of measurement terminals of the measurement terminal unit. PCB output pads of the 2-3-1 PCB output pad group electrically connected to the IC output pads may not be electrically connected to the plurality of measurement terminals of the measurement terminal unit. PCB output pads of the 1-3-2 PCB output pad group electrically connected to the IC output pads may not be electrically connected to the plurality of measurement terminals of the measurement terminal unit. PCB output pads of the 2-5 PCB output pad group electrically connected to the IC output pads may not be electrically connected to the plurality of measurement terminals of the measurement terminal unit. PCB output pads of the 1-2 PCB output pad group electrically connected to the IC output pads may not be electrically connected to the plurality of measurement terminals of the measurement terminal unit.

In an embodiment, each of the plurality of IC input pad units may include a plurality of IC input pad groups including a plurality of IC input pads, each of the plurality of PCB input pad units may include a plurality of PCB input pad groups including a plurality of PCB input pads, each of the plurality of IC output pad groups may include a first IC output pad, a second IC output pad, and a fourth IC output pad connected to each other, each of the plurality of IC input pad groups may include a first IC input pad electrically connected to the first IC output pad, a second IC input pad electrically connected to the second IC output pad, and a fourth IC input pad electrically connected to the fourth IC output pad, each of the plurality of PCB input pad groups may include a first PCB input pad connected to the first IC input pad, a second PCB input pad connected to the second IC input pad, a third PCB input pad connected to the second IC input pad, and a fourth PCB input pad connected to the fourth IC input pad, and each of the plurality of PCB output pad groups may include a first PCB output pad electrically connected to the first PCB input pad, a second PCB output pad electrically connected to the second PCB input pad, a third PCB output pad electrically connected to the third PCB input pad, and a fourth PCB output pad electrically connected to the fourth PCB input pad.

In an embodiment, the first PCB output pad may be connected to a first connection terminal, the second PCB output pad may be connected to a second connection terminal, the third PCB output pad may be connected to a third connection terminal, and the fourth PCB output pad may be connected to a fourth connection terminal.

In an embodiment, each of the plurality of flexible printed circuit boards may include a first upper transmission pad electrically connected to the first PCB input pad, a second upper transmission pad electrically connected to the second PCB input pad, a third upper transmission pad electrically connected to the third PCB input pad, a fourth upper transmission pad electrically connected to the fourth PCB input pad, a first lower transmission pad electrically connected to the first PCB output pad, a second lower transmission pad electrically connected to the second PCB output pad, a third lower transmission pad electrically connected to the third PCB output pad, and a fourth lower transmission pad electrically connected to the fourth PCB output pad. The first upper transmission pad is connected to the first lower transmission pad, the second upper transmission pad is connected to the second lower transmission pad, the third upper transmission pad is connected to the third lower transmission pad, and the fourth upper transmission pad is connected to the fourth lower transmission pad.

In an embodiment, each of the plurality of PCB input pad groups may further include a fifth PCB input pad and a sixth PCB input pad connected to each other, and each of the plurality of PCB output pad groups may further include a fifth PCB output pad connected to the fifth PCB input pad and a sixth PCB output pad connected to the sixth PCB input pad.

In an embodiment, the fifth PCB output pad of one PCB output pad group may be connected to one connection terminal or the sixth PCB output pad of an adjacent PCB output pad group, the sixth PCB output pad of one PCB output pad group may be connected to one connection terminal or the fifth PCB output pad an adjacent PCB output pad group, the connection terminal connected to the fifth PCB output pad may be electrically connected to some of the plurality of measurement terminals, and the connection terminal connected to the sixth PCB input pad may be electrically connected to some of the plurality of measurement terminals.

In an embodiment, each of the plurality of flexible printed circuit boards may include a fifth upper transmission pad electrically connected to the fifth PCB input pad, a sixth upper transmission pad electrically connected to the sixth PCB input pad, a fifth lower transmission pad electrically connected to the fifth PCB output pad, and a sixth lower transmission pad electrically connected to the sixth PCB output pad. The fifth upper transmission pad is connected to the fifth lower transmission pad, and the sixth upper transmission pad is connected to the sixth lower transmission pad.

According to an embodiment of the present disclosure, a display apparatus includes a display panel comprising at least one printed circuit board (PCB) input pad unit and at least one integrated circuit (IC) input pad unit including a plurality of IC input pads. A printed circuit board comprises a plurality of PCB output pad units and a measurement terminal unit. At least one flexible printed circuit board is directly connected to the display panel and the printed circuit board. At least one integrated circuit chip respectively connected to the at least one IC input pad unit. The measurement terminal unit comprises a plurality of measurement terminals arranged adjacent to each other. The at least one integrated circuit chip comprises a plurality of IC output pad groups comprising a plurality of IC output pads. Each of the plurality of PCB output pad units comprises a plurality of PCB output pad groups comprising a plurality of PCB output pads electrically connected to the plurality of IC output pads. A first portion of the plurality of PCB output pads electrically connected to the plurality of IC output pads are electrically connected to the plurality of measurement terminals. A second portion of the plurality of PCB output pads electrically connected to the plurality of IC output pads are not electrically connected to the plurality of measurement terminals.

In an embodiment, the measurement terminal unit measures connection resistance between the plurality of IC input pads and the plurality of IC output pads using a 4-terminal resistance measurement method.

In an embodiment, the second portion of the plurality of PCB output pads are disposed in a central portion of the display panel Other aspects, features, and advantages of the present disclosure will become more apparent from the detailed description, the claims, and the drawings.

BRIEF DESCRIPTION OF THE DRAWINGS

The above and other aspects, features, and advantages of non-limiting embodiments of the present disclosure will be more apparent from the following description taken in conjunction with the accompanying drawings, in which.

DETAILED DESCRIPTION OF EMBODIMENTS

Figure 1:
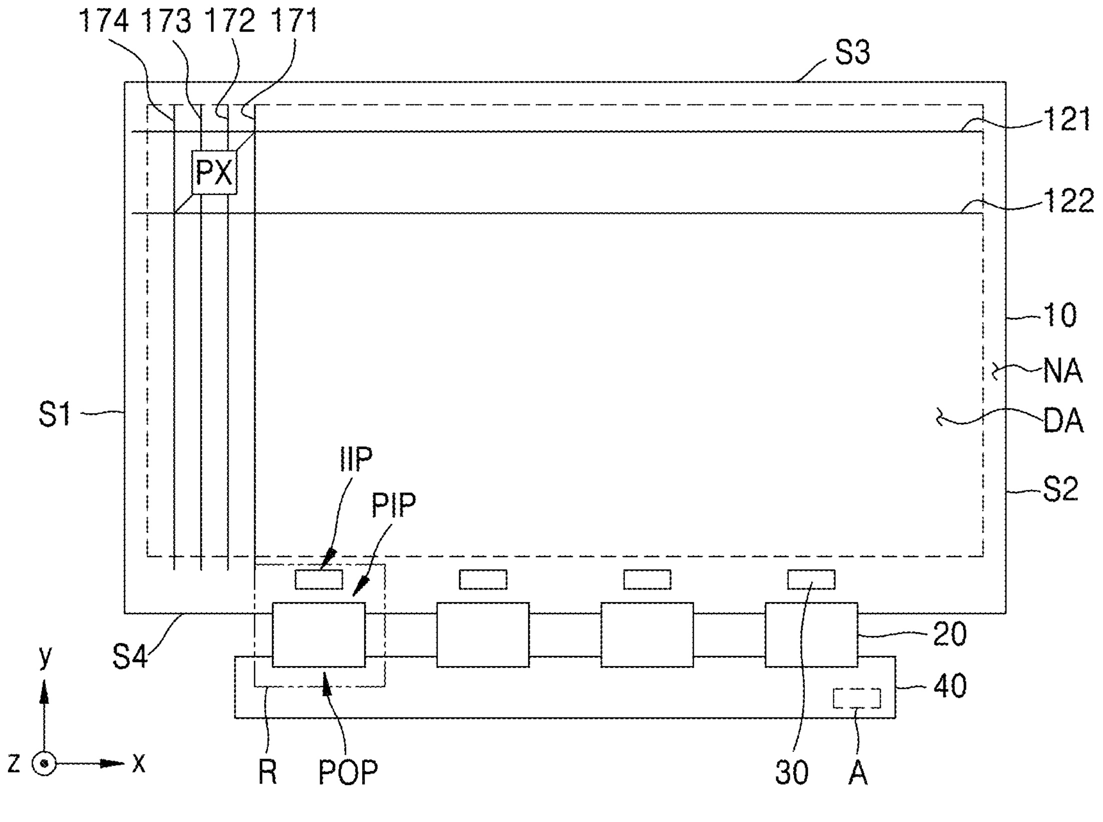
FIG. 1 is a plan view schematically illustrating a display apparatus, according to an embodiment of the present disclosure.

Reference will now be made in detail to embodiments, examples of which are illustrated in the accompanying drawings, wherein like reference numerals refer to like elements throughout. In this regard, embodiments of the present disclosure may have different forms and should not be construed as being limited to the descriptions set forth herein. Accordingly, non-limiting embodiments are merely described below, by referring to the figures, to explain aspects of the present description. As used herein, the term "and/or" includes any and all combinations of one or more of the associated listed items. Throughout the specification, the expression "at least one of a, b or c" indicates only a, only b, only c, both a and b, both a and c, both b and c, all of a, b, and c, or variations thereof.

As the present disclosure allows for various changes and numerous embodiments, non-limiting embodiments will be illustrated in the drawings and described in the detailed description. Effects and features of the present disclosure, and methods for achieving them will be clarified with reference to embodiments described below in detail with reference to the drawings. However, embodiments of the present disclosure are not limited to the following described embodiments and may be embodied in various forms.

While such terms as "first," "second," etc., may be used to describe various components, such components are not be limited to the above terms. The above terms are used only to distinguish one component from another.

The singular forms "a," "an," and "the" as used herein are intended to include the plural forms as well unless the context clearly indicates differently.

It will be further understood that the terms "comprises" or "comprising" used herein specify the presence of stated features or components, but do not preclude the presence or addition of one or more other features or components.

"A and/or B" is used herein to select only A, select only B, or select both A and B. "At least one of A and B" is used to select only A, select only B, or select both A and B.

It will be understood that when a component, such as a layer, a film, a region, or a plate, is referred to as being "on" another component, the component may be directly on the other component or intervening components may be present therebetween. When a component, such as a layer, a film, a region, or a plate, is referred to as being "directly on" another component, no intervening components may be present.

In the specification, it will be understood that when a layer, a region, or a component is referred to as being "connected" to another layer, region, or component, it may be "directly connected" to the other layer, region, or component and/or may be "indirectly connected" to the other layer, region, or component with other layers, regions, or components interposed therebetween. For example, when a layer, a region, or a component is referred to as being "electrically connected," it may be directly electrically connected, and/or may be indirectly electrically connected with intervening layers, regions, or components therebetween.

In the following embodiments, the x-axis, the y-axis and the z-axis are not necessarily limited to three axes of the rectangular coordinate system, and may be interpreted in a broader sense. For example, the x-axis, the y-axis, and the z-axis may be perpendicular to one another or may represent different directions that are not perpendicular to one another.

When a certain embodiment may be implemented differently, a specific process order may be different from the described order. For example, two consecutively described processes may be performed substantially at the same time or may be performed in an order opposite to the described order.

In the specification, the phrase "in a plan view" means when an object portion is viewed from above. For example, in the specification, the phrase "in a plan view" means when "an object portion is viewed in a direction perpendicular to a display panel".

Hereinafter, non-limiting embodiments will be described in detail with reference to the accompanying drawings, wherein the same or corresponding elements are denoted by the same reference numerals throughout and a repeated description thereof is omitted. Sizes of components in the drawings may be exaggerated or contracted for convenience of explanation. For example, since sizes and thicknesses of components in the drawings are arbitrarily illustrated for convenience of explanation, embodiments of the present disclosure are not necessarily limited thereto.

FIG. 1 is a plan view schematically illustrating a display apparatus, according to an embodiment.

In one or more embodiments, an electronic apparatus may include the display apparatus described below. In other words, the display apparatus according to an embodiment may be implemented as an electronic apparatus such as a smartphone, a mobile phone, a navigation device, a game device, a television (TV), a vehicle head unit, a notebook computer, a laptop computer, a tablet computer, a personal media player (PMP), or a personal digital assistant (PDA). In an embodiment, the electronic apparatus may be a flexible apparatus.

Referring to FIG. 1, in an embodiment the display apparatus may include a display panel 10, a flexible printed circuit board 20, an integrated circuit chip 30, and a printed circuit board 40.

As shown in FIG. 1, in an embodiment the display panel 10 may have a rectangular shape or a square shape in a plan view. For example, the display panel 10 may include a first side S1 and a second side S2 facing each other (e.g., in the x axis direction), and a third side S3 and a fourth side S4 facing each other (e.g., in the y axis direction) and located between the first side S1 and the second side S2. In an embodiment, a PCB input pad unit PIP and an IC input pad unit IIP may be adjacent to the fourth side S4 from among the first side S1 to the fourth side S4. For example, in an embodiment the first side S1 may be a left side of the display panel 10, the second side S2 may be a right side of the display panel 10, the third side S3 may be an upper side of the display panel 10, and the fourth side S4 may be a lower side of the display panel 10. The first side S1 and the third side S3 may directly contact each other to form a corner, and the first side S1 may directly contact the fourth side S4 to form a corner. The second side S2 may directly contact the third side S3 to form a corner, and the second side S2 may directly contact the fourth side S4 to form a corner. Although corners are sharp in FIG. 1, embodiments of the present disclosure are not necessarily limited thereto. For example, corners may be rounded in some embodiments.

The display panel 10 may include a display area DA and a non-display area NA. The display area DA is a portion where an image is displayed, and the non-display area NA around the display area DA is a portion where circuits and/or signal lines for generating and/or transmitting various signals applied to the display area DA are located. The non-display area NA may surround the display area DA (e.g., in a plan view). In FIG. 1, a boundary between the display area DA and the non-display area NA is marked by a dashed line.

Pixels PX are located in the display area DA of the display panel 10. In an embodiment, signal lines such as a first scan line 121, a second scan line 122, a data line 171, a driving voltage line 172, a common voltage line 173, and/or an initialization voltage line 174 may be located in (e.g., disposed therein) the display area DA. The first scan line 121 and the second scan line 122 may extend substantially in a first direction (e.g., the x axis direction). The data line 171, the driving voltage line 172, the common voltage line 173, and the initialization voltage line 174 may extend substantially in a second direction (e.g., the y axis direction). The second direction may intersect the first direction. However, embodiments of the present disclosure are not necessarily limited thereto. For example, in an embodiment at least one of the driving voltage line 172, the common voltage line 173, and the initialization voltage line 174 may have a mesh shape including a portion extending substantially in the first direction (e.g., the x axis direction) and a portion extending substantially in the second direction (e.g., the y axis direction).

In an embodiment, each pixel PX may be connected to the first scan line 121, the second scan line 122, the data line 171, the driving voltage line 172, the common voltage line 173, and/or the initialization voltage line 174 to receive a first scan signal, a second scan signal, a data voltage, a driving voltage, a common voltage, and/or an initialization voltage from these signal lines. The pixel PX may include a light-emitting element such as a light-emitting diode.

In an embodiment, an input pad unit including input pads to which external signals are input may be located in (e.g., disposed therein) the non-display area NA of the display panel 10. For example, the PCB input pad unit PIP and the IC input pad unit IIP may be located in (e.g., disposed therein) the non-display area NA of the display panel 10. For example, the display panel 10 may include the PCB input pad unit PIP and the IC input pad unit IIP.

A plurality of PCB input pad units PIP may be provided. In an embodiment, the plurality of PCB input pad units PIP may be arranged to be spaced apart from each other along the fourth side S4 of the display panel 10. A first end of the flexible printed circuit board 20 may be connected to the plurality of PCB input pad units PIP. Accordingly, an upper transmission pad located at the first end of the flexible printed circuit board 20 may be electrically connected to a PCB input pad of the PCB input pad unit PIP of the display panel 10. Since the plurality of PCB input pad units PIP are spaced apart from each other (e.g., in the x axis direction), a corresponding first end of the flexible printed circuit board 20 may be connected to each of the plurality of PCB input pad units PIP. In some embodiments, one flexible printed circuit board 20 may be connected to the plurality of PCB input pad units PIP.

A plurality of IC input pad units IIP may be provided. The IC input pad units IIP may be located between the PCB input pad units PIP and the display area DA (e.g., in the y axis direction). The integrated circuit chip 30 may be connected to the plurality of IC input pad units IIP. An IC output pad of the integrated circuit chip 30 may be electrically connected to an IC input pad of the IC input pad unit IIP of the display panel 10. For example, the integrated circuit chip 30 may be connected to the display panel 10.

The display apparatus may include a driving unit for generating and/or processing various signals for driving the display panel 10. The driving unit may include a data driving unit for applying a data signal to the data line 171 and a gate driving unit for applying a gate signal to the first scan line 121 and the second scan line 122. A data signal or the like may be applied to the pixels PX at a certain timing according to a scan signal generated by the gate driving unit. The gate driving unit may be located in the non-display area NA of the display panel 10. The data driving unit may be included in the integrated circuit chip 30. The driving unit may further include a signal control unit for controlling the data driving unit and the gate driving unit.

In an embodiment, a PCB output pad unit POP may be located at one edge (e.g., in the +y direction) of the printed circuit board 40. For example, the printed circuit board 40 may include the PCB output pad unit POP. A plurality of PCB output pad units POP may be provided. The plurality of PCB output pad units POP may be arranged to be spaced apart from each other at one edge (e.g., in the +y direction) of the printed circuit board 40. A second end of the flexible printed circuit board is a portion opposite to the first end of the flexible printed circuit board 20, and may be connected to the PCB output pad unit POP of the printed circuit board 40. Accordingly, lower transmission pads located at the second end of the flexible printed circuit board 20 may be electrically connected to PCB output pads of the PCB output pad unit POP of the printed circuit board 40.

Since the PCB output pad units POP are spaced apart from each other, a corresponding second end of the flexible printed circuit board 20 may be connected to each of the PCB output pad units POP. In an embodiment, one flexible printed circuit board 20 may be connected to the PCB output pad units POP. The upper transmission pads located at the first end of the flexible printed circuit board 20 may be respectively electrically connected to the lower transmission pads located at the second end of the flexible printed circuit board 20. Accordingly, the flexible printed circuit board 20 may include a connection pattern that electrically connects each of the PCB output pad units POP to each of the PCB input pad units PIP corresponding to each of the PCB output pad units POP.

In an embodiment, a measurement terminal unit MT (see FIG. 5) may be located on (e.g., disposed thereon) the printed circuit board 40. For example, the printed circuit board 40 may include the measurement terminal unit MT. In an embodiment, measurement terminals of the measurement terminal unit MT may be electrically connected to multiple terminals of the printed circuit board 40. Accordingly, multiple connection resistances may be measured by measuring the measurement terminals of the measurement terminal unit MT.

In an embodiment, a plurality of integrated circuit chips 30 may be provided. The plurality of integrated circuit chips 30 may be respectively connected to the IC input pad units IIP between the PCB input pad units PIP and the display area DA. For example, the plurality of integrated circuit chips 30 may be connected to the display panel 10. In an embodiment, the integrated circuit chip 30 may be mounted in the non-display area NA of the display panel 10 as a chip-on-glass (CGO) type or a chip-on-film (COF) type.

Signals output from the integrated circuit chip 30 may be transmitted to the display panel 10 through the IC output pad of the integrated circuit chip 30 and the IC input pad of the display panel 10. As described above, the integrated circuit chip 30 may output signals provided to the display area DA. For example, in an embodiment the integrated circuit chip 30 may output a data voltage, a driving voltage, a common voltage, and/or an initialization voltage. In an embodiment, a data voltage transmission line, a driving voltage transmission line, a common voltage transmission line, and/or an initialization voltage transmission line for transmitting a data voltage, a driving voltage, a common voltage, and/or an initialization voltage output from the integrated circuit chip 30 to the data line 171, the driving voltage line 172, the common voltage line 173, and/or the initialization voltage line 174 of the display area DA may be located in the non-display area NA. The integrated circuit chip 30 may also output signals for controlling the gate driving unit.

In an embodiment, the integrated circuit chip 30 may receive, from the printed circuit board 40, signals (e.g., image data and a signal or power related to the image data) based on which the above signals are generated. For example, signals of the printed circuit board 40 may be transmitted to the integrated circuit chip 30 through the display panel 10. The integrated circuit chip 30 may generate new signals from the signals received from the printed circuit board 40 and may transmit the new signals to the display panel 10.

A processor and/or a memory may be located on the printed circuit board 40. For example, in an embodiment in which the display apparatus is applied to a mobile communication terminal, the processor may be an application processor including a central processing unit, a graphics processing unit, and/or a modem. In an embodiment, the flexible printed circuit board 20 may be bendable, and thus, the printed circuit board 40 may be located on a rear surface (−z direction) of the display panel 10.

Figure 2:
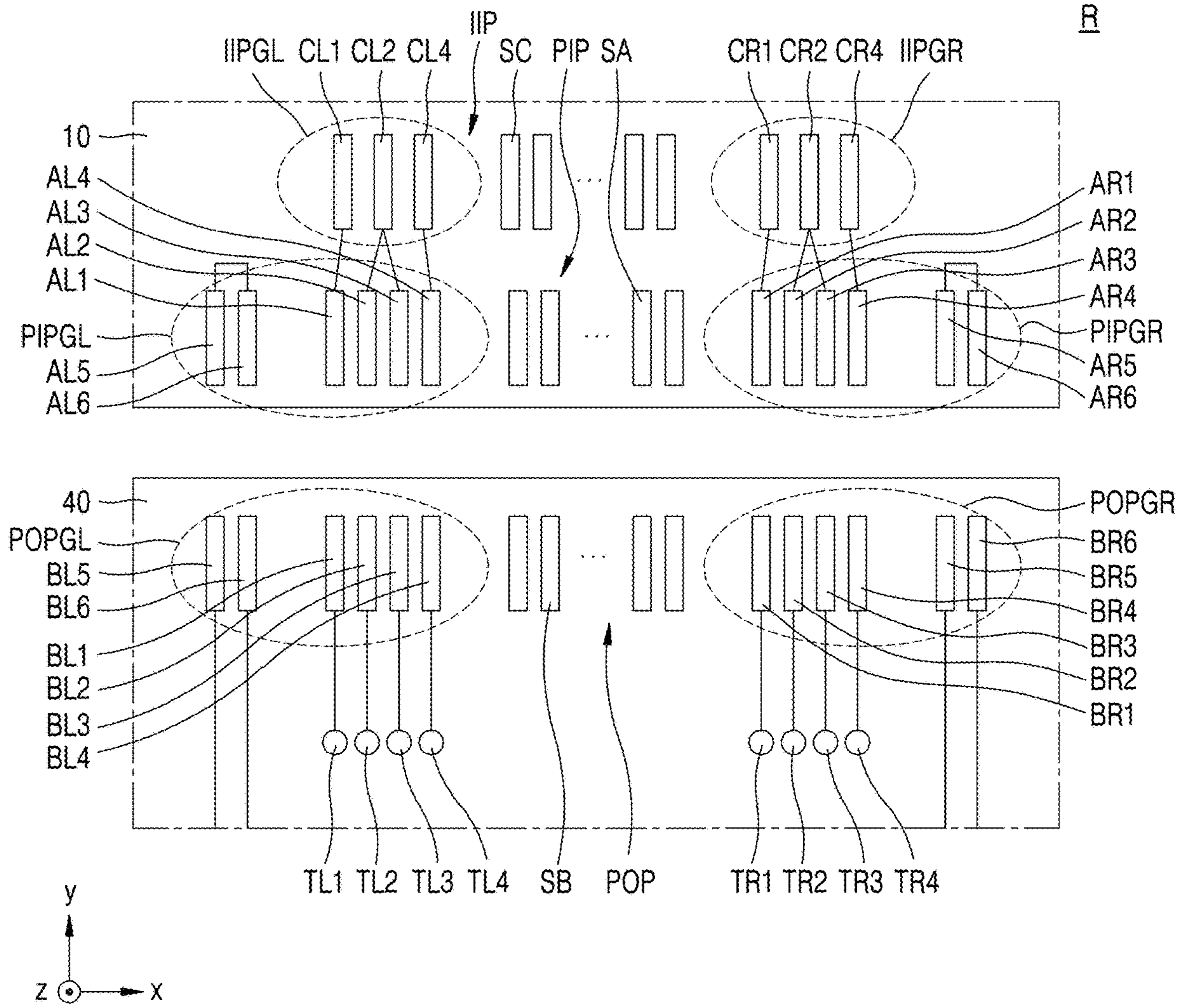
FIG. 2 is an enlarged view illustrating a portion “R” of FIG. 1, excluding a flexible printed circuit board and an integrated circuit chip according to an embodiment of the present disclosure.
Figure 3:
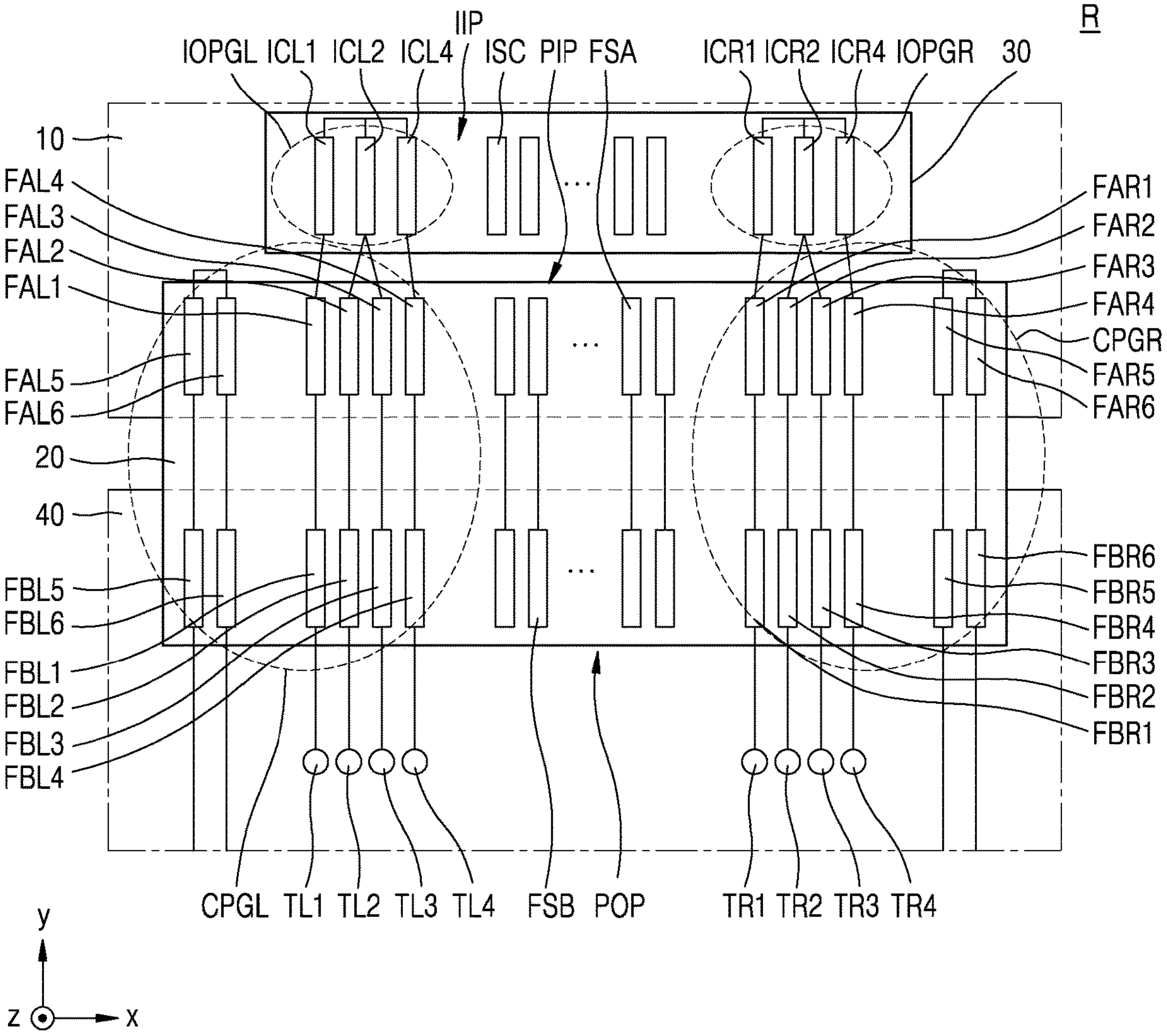
FIG. 3 is an enlarged view illustrating the portion “R” of FIG. 1 according to an embodiment of the present disclosure.

FIG. 2 is an enlarged view illustrating a portion "R" of FIG. 1, excluding the flexible printed circuit board 20 and the integrated circuit chip 30. FIG. 3 is an enlarged view illustrating the portion "R" of FIG. 1.

As described above, the display panel 10 includes a plurality of PCB input pad units PIP and a plurality of IC input pad units IIP, and the printed circuit board 40 includes a plurality of PCB output pad units POP. The PCB input pad units PIP and the PCB output pad units POP may be electrically connected to each other by a plurality of flexible printed circuit boards 20. A plurality of integrated circuit chips 30 may be respectively electrically connected to the IC input pad units IIP. Structures of the plurality of PCB input pad units PIP are the same, structures of the plurality of PCB output pad units POP are the same, and structures of the plurality of flexible printed circuit boards 20 are the same. Structures of the plurality of IC input pad units IIP are the same, and structures of the plurality of integrated circuit chips 30 are the same. Accordingly, one PCB input pad unit PIP, one PCB output pad unit POP, one flexible printed circuit board 20, one IC input pad unit IIP, and one integrated circuit chip 30 will be mainly described for economy of description.

In an embodiment, the PCB output pad unit POP on the printed circuit board 40 may include a first PCB output pad group POPGL and a second PCB output pad group POPGR each including a plurality of PCB output pads. For example, in an embodiment the first PCB output pad group POPGL may include a 1-1 PCB output pad BL1, a 1-2 PCB output pad BL2, a 1-3 PCB output pad BL3, a 1-4 PCB output pad BL4, a 1-5 PCB output pad BL5, and a 1-6 PCB output pad BL6, and the second PCB output pad group POPGR may include a 2-1 PCB output pad BR1, a 2-2 PCB output pad BR2, a 2-3 PCB output pad BR3, a 2-4 PCB output pad BR4, a 2-5 PCB output pad BR5, and a 2-6 PCB output pad BR6. For example, the 1-1 PCB output pad BL1, the 1-2 PCB output pad BL2, the 1-3 PCB output pad BL3, the 1-4 PCB output pad BL4, the 1-5 PCB output pad BL5, the 1-6 PCB output pad BL6, the 2-1 PCB output pad BR1, the 2-2 PCB output pad BR2, the 2-3 PCB output pad BR3, the 2-4 PCB output pad BR4, the 2-5 PCB output pad BR5, and the 2-6 PCB output pad BR6 may be test pads for measuring connection resistance. However, embodiments of the present disclosure are not necessarily limited thereto and the number of output pads of the first PCB output pad group POPGL and the second PCB output pad group POPGR may vary.

In an embodiment, the 1-1 PCB output pad BL1 of the first PCB output pad group POPGL may be connected to a 1-1 connection terminal TL1, the 1-2 PCB output pad BL2 may be connected to a 1-2 connection terminal TL2, the 1-3 PCB output pad BL3 may be connected to a 1-3 connection terminal TL3, and the 1-4 PCB output pad BL4 may be connected to a 1-4 connection terminal TL4. The 1-5 PCB output pad BL5 of the first PCB output pad group POPGL may be connected to one connection terminal or may be connected to the 2-6 PCB output pad BR6 of the adjacent second PCB output pad group POPGR. The 1-6 PCB output pad BL6 of the first PCB output pad group POPGL may be connected to one connection terminal or may be connected to the 2-5 PCB output pad BR5 of the adjacent second PCB output pad group POPGR. The connection terminal connected to the 1-5 PCB output pad BL5 and the connection terminal connected to the 1-6 PCB output pad BL6 may be electrically connected to some of measurement terminals described below.

In an embodiment, the 2-1 PCB output pad BR1 of the second PCB output pad group POPGR may be connected to a 2-1 connection terminal TR1, the 2-2 PCB output pad BR2 may be connected to a 2-2 connection terminal TR2, the 2-3 PCB output pad BR3 may be connected to a 2-3 connection terminal TR3, and the 2-4 PCB output pad BR4 may be connected to a 2-4 connection terminal TR4. The 2-5 PCB output pad BR5 of the second PCB output pad group POPGR may be connected to one connection terminal or may be connected to the 1-6 PCB output pad BL6 of the adjacent first PCB output pad group POPGL. The 2-6 PCB output pad BR6 of the second PCB output pad group POPGR may be connected to one connection terminal or may be connected to the 1-5 PCB output pad BL5 of the adjacent first PCB output pad group POPGL. The connection terminal connected to the 2-5 PCB output pad BR5 and the connection terminal connected to the 2-6 PCB output pad BR6 may be electrically connected to some of measurement terminals described below.

In an embodiment, the PCB input pad unit PIP of the display panel 10 may include a first PCB input pad group PIPGL and a second PCB input pad group PIPGR each including a plurality of PCB input pads. The IC input pad unit IIP of the display panel 10 may also include a first IC input pad group IIPGL and a second IC input pad group IIPGR each including a plurality of IC input pads.

For example, in an embodiment the first PCB input pad group PIPGL may include a 1-1 PCB input pad AL1, a 1-2 PCB input pad AL2, a 1-3 PCB input pad AL3, a 1-4 PCB input pad AL4, a 1-5 PCB input pad AL5, and a 1-6 PCB input pad AL6, and the second PCB input pad group PIPGR may include a 2-1 PCB input pad AR1, a 2-2 PCB input pad AR2, a 2-3 PCB input pad AR3, a 2-4 PCB input pad AR4, a 2-5 PCB input pad AR5, and a 2-6 PCB input pad AR6. For example, in an embodiment the 1-1 PCB input pad AL1, the 1-2 PCB input pad AL2, the 1-3 PCB input pad AL3, the 1-4 PCB input pad AL4, the 1-5 PCB input pad AL5, the 1-6 PCB input pad AL6, the 2-1 PCB input pad AR1, the 2-2 PCB input pad AR2, the 2-3 PCB input pad AR3, the 2-4 PCB input pad AR4, the 2-5 PCB input pad AR5, and the 2-6 PCB input pad AR6 may be test pads for measuring connection resistance. However, embodiments of the present disclosure are not necessarily limited thereto and the number of input pads of the first PCB input pad group PIPGL and the second PCB input pad group PIPGR may vary. In an embodiment, the first IC input pad group IIPGL may include a 1-1 IC input pad CL1, a 1-2 IC input pad CL2, and a 1-4 IC input pad CL4, and the second IC input pad group IIPGR may include a 2-1 IC input pad CR1, a 2-2 IC input pad CR2, and a 2-4 IC input pad CR4. That is, the 1-1 IC input pad CL1, the 1-2 IC input pad CL2, the 1-4 IC input pad CL4, the 2-1 IC input pad CR1, the 2-2 IC input pad CR2, and the 2-4 IC input pad CR4 may be test pads for measuring connection resistance. However, embodiments of the present disclosure are not necessarily limited thereto and the number of input pads of the first IC input pad group IIPGL and the second IC input pad group IIPGR may vary.

In an embodiment, the 1-1 PCB input pad AL1 may be connected to the 1-1 IC input pad CL1, the 1-2 PCB input pad AL2 and the 1-3 PCB input pad AL3 may be connected to the 1-2 IC input pad CL2, and the 1-4 PCB input pad AL4 may be connected to the 1-4 IC input pad CL4. The 1-5 PCB input pad AL5 and the 1-6 PCB input pad AL6 may be connected to each other. In an embodiment, the 2-1 PCB input pad AR1 may be connected to the 2-1 IC input pad CR1, the 2-2 PCB input pad AR2 and the 2-3 PCB input pad AR3 may be connected to the 2-2 IC input pad CR2, and the 2-4 PCB input pad AR4 may be connected to the 2-4 IC input pad CR4. The 2-5 PCB input pad AR5 and the 2-6 PCB input pad AR6 may be connected to each other. In an embodiment, one PCB input pad may be connected to one IC input pad or another PCB input pad through a wiring of the display panel 10. However, embodiments of the present disclosure are not necessarily limited thereto.

As shown in FIG. 3, the flexible printed circuit board 20 may respectively electrically connect PCB input pads included in the first PCB input pad group PIPGL and the second PCB input pad group PIPGR to PCB output pads included in the first PCB output pad group POPGL and the second PCB output pad group POPGR. For example, in an embodiment a first end of the flexible printed circuit board 20 may be adhered to the display panel 10 and a second end of the flexible printed circuit board 20 may be adhered to the printed circuit board 40 so that PCB input pads included in the first PCB input pad group PIPGL and the second PCB input pad group PIPGR are respectively electrically connected to PCB output pads included in the first PCB output pad group POPGL and the second PCB output pad group POPGR. For example, in an embodiment the flexible printed circuit board 20 may have a first portion adhered to display panel 10 and a second portion adhered to the printed circuit board 40.

In an embodiment, the flexible printed circuit board 20 may include a first transmission pad group CPGL and a second transmission pad group CPGR each including a plurality of transmission pads. In an embodiment, the first transmission pad group CPGL may include a 1-1 upper transmission pad FAL1, a 1-2 upper transmission pad FAL2, a 1-3 upper transmission pad FAL3, a 1-4 upper transmission pad FAL4, a 1-5 upper transmission pad FAL5, and a 1-6 upper transmission pad FAL6 as upper transmission pads, and the first transmission pad group CPGL may include a 1-1 lower transmission pad FBL1, a 1-2 lower transmission pad FBL2, a 1-3 lower transmission pad FBL3, a 1-4 lower transmission pad FBL4, a 1-5 lower transmission pad FBL5, and a 1-6 lower transmission pad FBL6 as lower transmission pads. For example, the 1-1 upper transmission pad FAL1, the 1-2 upper transmission pad FAL2, the 1-3 upper transmission pad FAL3, the 1-4 upper transmission pad FAL4, the 1-5 upper transmission pad FAL5, the 1-6 upper transmission pad FAL6, the 1-1 lower transmission pad FBL1, the 1-2 lower transmission pad FBL2, the 1-3 lower transmission pad FBL3, the 1-4 lower transmission pad FBL4, the 1-5 lower transmission pad FBL5, and the 1-6 lower transmission pad FBL6 may be test pads for measuring connection resistance.

In an embodiment, the second transmission pad group CPGR may include a 2-1 upper transmission pad FAR1, a 2-2 upper transmission pad FAR2, a 2-3 upper transmission pad FAR3, a 2-4 upper transmission pad FAR4, a 2-5 upper transmission pad FAR5, and a 2-6 upper transmission pad FAR6 as upper transmission pads, and the second transmission pad group CPGR may further include a 2-1 lower transmission pad FBR1, a 2-2 lower transmission pad FBR2, a 2-3 lower transmission pad FBR3, a 2-4 lower transmission pad FBR4, a 2-5 lower transmission pad FBR5, and a 2-6 lower transmission pad FBR6 as lower transmission pads. For example, the 2-1 upper transmission pad FAR1, the 2-2 upper transmission pad FAR2, the 2-3 upper transmission pad FAR3, the 2-4 upper transmission pad FAR4, the 2-5 upper transmission pad FAR5, the 2-6 upper transmission pad FAR6, the 2-1 lower transmission pad FBR1, the 2-2 lower transmission pad FBR2, the 2-3 lower transmission pad FBR3, the 2-4 lower transmission pad FBR4, the 2-5 lower transmission pad FBR5, and the 2-6 lower transmission pad FBR6 may be test pads for measuring connection resistance. However, embodiments of the present disclosure are not necessarily limited thereto and the number of the transmission pads of the first transmission pad group CPGL and the second transmission pad group CPGR may vary.

In an embodiment, the 1-1 upper transmission pad FAL1 may be connected to the 1-1 lower transmission pad FBL1, the 1-2 upper transmission pad FAL2 may be connected to the 1-2 lower transmission pad FBL2, and the 1-3 upper transmission pad FAL3 may be connected to the 1-3 lower transmission pad FBL3. The 1-4 upper transmission pad FAL4 may be connected to the 1-4 lower transmission pad FBL4, the 1-5 upper transmission pad FAL5 may be connected to the 1-5 lower transmission pad FBL5, and the 1-6 upper transmission pad FAL6 may be connected to the 1-6 lower transmission pad FBL6. In an embodiment, the 2-1 upper transmission pad FAR1 may be connected to the 2-1 lower transmission pad FBR1, the 2-2 upper transmission pad FAR2 may be connected to the 2-2 lower transmission pad FBR2, and the 2-3 upper transmission pad FAR3 may be connected to the 2-3 lower transmission pad FBR3. The 2-4 upper transmission pad FAR4 may be connected to the 2-4 lower transmission pad FBR4, the 2-5 upper transmission pad FAR5 may be connected to the 2-5 lower transmission pad FBR5, and the 2-6 upper transmission pad FAR6 may be connected to the 2-6 lower transmission pad FBR6. In an embodiment, one upper transmission pad may be connected to one lower transmission pad through a wiring of the flexible printed circuit board 20. However, embodiments of the present disclosure are not necessarily limited thereto.

As shown in FIG. 3, in an embodiment the integrated circuit chip 30 may also include a first IC output pad group IOPGL and a second IC output pad group IOPGR each including a plurality of IC output pads. In an embodiment, the first IC output pad group IOPGL may include a 1-1 IC output pad ICL1, a 1-2 IC output pad ICL2, and a 1-4 IC output pad ICL4, and the second IC output pad group IOPGR may include a 2-1 IC output pad ICR1, a 2-2 IC output pad ICR2, and a 2-4 IC output pad ICR4. For example, the 1-1 IC output pad ICL1, the 1-2 IC output pad ICL2, the 1-4 IC output pad ICL4, the 2-1 IC output pad ICR1, the 2-2 IC output pad ICR2, and the 2-4 IC output pad ICR4 may be test pads for measuring connection resistance. The 1-1 IC output pad ICL1, the 1-2 IC output pad ICL2, and the 1-4 IC output pad ICL4 may be connected to each other, and the 2-1 IC output pad ICR1, the 2-2 IC output pad ICR2, and the 2-4 IC output pad ICR4 may be connected to each other. However, embodiments of the present disclosure are not necessarily limited thereto and the number of the output pads of the first IC output pad group IOPGL and the second IC output pad group IOPGR may vary. In an embodiment, one IC output pad may be connected to another IC output pad through a wiring of the integrated circuit chip 30. However, embodiments of the present disclosure are not necessarily limited thereto.

Figure 4:
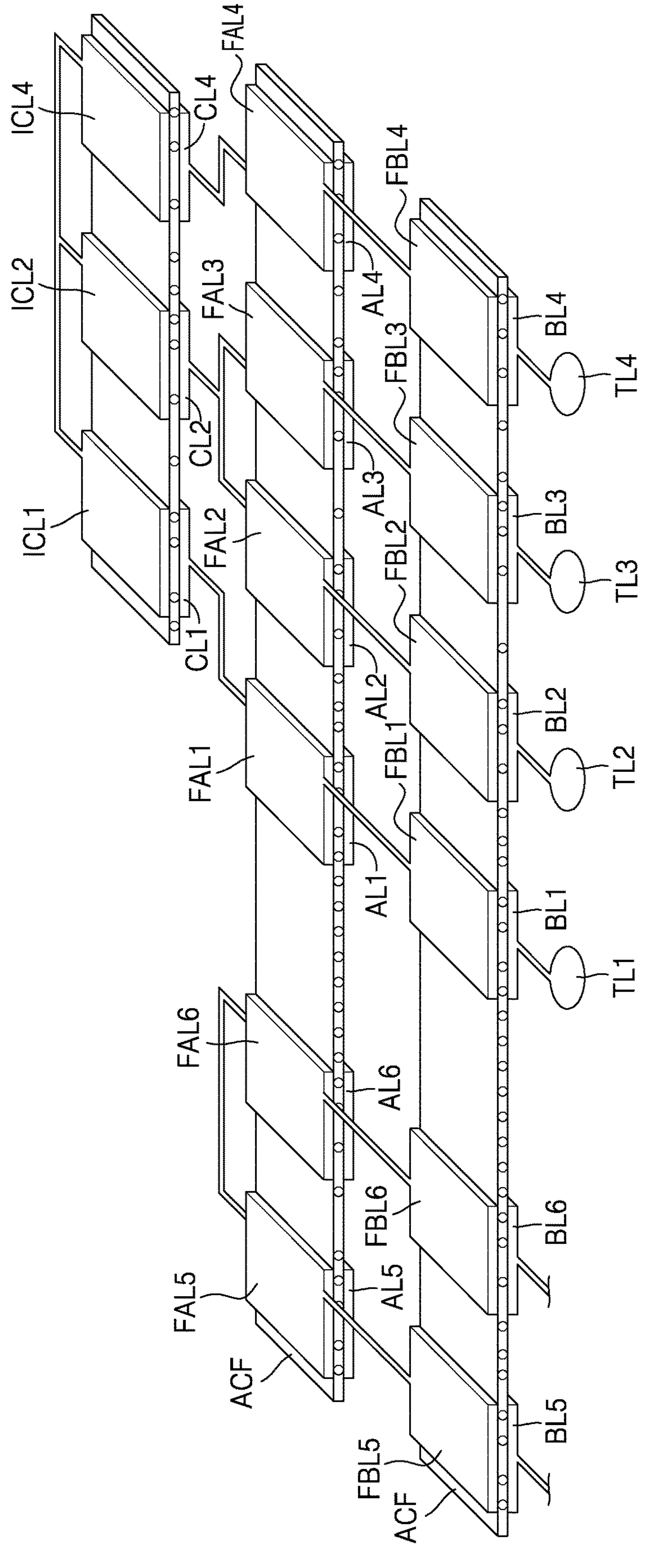
FIG. 4 is a conceptual view for describing measurement of connection resistance according to an embodiment of the present disclosure.

In an embodiment, PCB output pads of the first PCB output pad group POPGL of the printed circuit board 40 and lower transmission pads of the first transmission pad group CPGL of the flexible printed circuit board 20 may be electrically connected to each other by an anisotropic conductive film ACF (see FIG. 4). Likewise, PCB output pads of the first PCB output pad group PIPGL of the display panel 10 and upper transmission pads of the first transmission pad group CPGL of the flexible printed circuit board 20 may be electrically connected to each other by an anisotropic conductive film ACF, and IC input pads of the first IC input pad group IIPGL of the display panel and IC output pads of the first IC output pad group IOPGL of the integrated circuit chip 30 may be electrically connected to each other by an anisotropic conductive film ACF.

Some of PCB output pads of the first PCB output pad group POPGL of the printed circuit board 40 may be electrically connected to some of PCB input pads of the first PCB input pad group PIPGL of the display panel 10 through the flexible printed circuit board 20 in this manner. Some others of PCB output pads of the first PCB output pad group POPGL of the printed circuit board 40 may be electrically connected to IC output pads of the first IC output pad group IOPGL of the integrated circuit chip 30 through the flexible printed circuit board 20 and the display panel 10 in this manner.

This is the same for the second PCB output pad group POPGR, the second PCB input pad group PIPGR, and the second IC output pad group IOPGR. For example, PCB output pads of the second PCB output pad group POPGR of the printed circuit board 40 and lower transmission pads of the second transmission pad group CPGR of the flexible printed circuit board 20 may be electrically connected to each other by an anisotropic conductive film ACF. Likewise, PCB input pads of the second PCB input pad group PIPGR of the display panel 10 and upper transmission pads of the second transmission pad CPGR of the flexible printed circuit board 20 may be electrically connected to each other by an anisotropic conductive film ACF, and IC input pads of the second IC input pad group IIPGR of the display panel and IC output pads of the second IC output pad group IOPGR may be electrically connected to each other by an anisotropic conductive film ACF. For example, each of the plurality of PCB output pad groups POPG may include a plurality of PCB output pads electrically connected to a plurality of IC output pads.

Some of PCB output pads of the second PCB output pad group POPGR of the printed circuit board 40 may be electrically connected to some of PCB input pads of the second PCB input pad group PIPG2 of the display panel 10 through the flexible printed circuit board 20 in this manner. Some others of PCB output pads of the second PCB output pad group POPG2 of the printed circuit board 40 may be electrically connected to IC output pads of the second IC output pad group IOPGR of the integrated circuit chip 30 through the flexible printed circuit board 20 and the display panel 10 in this manner.

For example, in an embodiment the 1-1 PCB output pad BL1 is electrically connected to the 1-1 lower transmission pad FBL1, and the 1-1 upper transmission pad FAL1 connected to the 1-1 lower transmission pad FBL1 is electrically connected to the 1-1 PCB input pad AL1. The 1-1 IC input pad CL1 connected to the 1-1 PCB input pad AL1 is electrically connected to the 1-1 IC output pad ICL1. Accordingly, the 1-1 PCB output pad BL1 may be electrically connected to the 1-1 IC output pad ICL1. The 1-4 PCB output pad BL4 is electrically connected to the 1-4 lower transmission pad FBL4, and the 1-4 upper transmission pad FAL4 connected to the 1-4 lower transmission pad FBL4 is electrically connected to 1-4 PCB input pad AL4. The 1-4 IC input pad CL4 connected to the 1-4 PCB input pad AL4 is electrically connected to the 1-4 IC output pad ICL4. Accordingly, the 1-4 PCB output pad BL4 may be electrically connected to the 1-4 IC output pad ICL4.

In an embodiment, the 1-2 PCB output pad BL2 is electrically connected to the 1-2 lower transmission pad FBL2, and the 1-2 upper transmission pad FAL2 connected to the 1-2 lower transmission pad FBL2 is electrically connected to the 1-2 PCB input pad AL2. The 1-2 IC input pad CL2 connected to the 1-2 PCB input pad AL2 is electrically connected to the 1-2 IC output pad ICL2. The 1-3 PCB output pad BL3 is connected to the 1-3 lower transmission pad FBL3, and 1-3 upper transmission pad FAL3 connected to the 1-3 lower transmission pad FBL3 is electrically connected to the 1-3 PCB input pad AL3. The 1-2 IC input pad CL2 connected to the 1-3 PCB input pad AL3 is electrically connected to the 1-2 IC output pad ICL2. Accordingly, the 1-2 PCB output pad BL2 and the 1-3 PCB output pad BL3 may be electrically connected to the 1-2 IC output pad ICL2.

In an embodiment, the 1-5 PCB output pad BL5 is electrically connected to the 1-5 lower transmission pad FBL5, and the 1-5 upper transmission pad FAL5 connected to the 1-5 lower transmission pad FBL5 is electrically connected to the 1-5 PCB input pad AL5. The 1-6 PCB output pad BL6 is electrically connected to the 1-6 lower transmission pad FBL6, and the 1-6 upper transmission pad FAL6 connected to the 1-6 lower transmission pad FBL6 is electrically connected to the 1-6 PCB input pad AL6. Accordingly, the 1-5 PCB output pad BL5 may be electrically connected to the 1-5 PCB input pad AL5, and the 1-6 PCB output pad BL6 may be electrically connected to the 1-6 PCB input pad AL6.

In an embodiment, the 2-1 PCB output pad BR1 is electrically connected to the 2-1 lower transmission pad FBR1, and the 2-1 upper transmission pad FAR1 connected to the 2-1 lower transmission pad FBR1 is electrically connected to the 2-1 PCB input pad AR1. The 2-1 IC input pad CR1 connected to the 2-1 PCB input pad AR1 is electrically connected to the 2-1 IC output pad ICR1. Accordingly, the 2-1 PCB output pad BR1 may be electrically connected to the 2-1 IC output pad ICR1. The 2-4 PCB output pad BR4 is electrically connected to the 2-4 lower transmission pad FBR4, and the 2-4 upper transmission pad FAR4 connected to the 2-4 lower transmission pad FBR4 is electrically connected to the 2-4 PCB input pad AR4. The 2-4 IC input pad CR4 connected to the 2-4 PCB input pad AR4 is electrically connected to the 2-4 IC output pad ICR4. Accordingly, the 2-4 PCB output pad BR4 may be electrically connected to the 2-4 IC output pad ICR4.

In an embodiment, the 2-2 PCB output pad BR2 is electrically connected to the 2-2 lower transmission pad FBR2, and the 2-2 upper transmission pad FAR2 connected to the 2-2 lower transmission pad FBR2 is electrically connected to the 2-2 PCB input pad AR2. The 2-2 IC input pad CR2 connected to the 2-2 PCB input pad AR2 is electrically connected to the 2-2 IC output pad ICR2. The 2-3 PCB output pad BR3 is electrically connected to the 2-3 lower transmission pad FBR3, and the 2-3 upper transmission pad FAR3 connected to the 2-3 lower transmission pad FBR3 is electrically connected to the 2-3 PCB input pad AR3. The 2-2 IC input pad CR2 connected to the 2-3 PCB input pad AR3 is electrically connected to the 2-2 IC output pad ICR2. Accordingly, the 2-2 PCB output pad BR2 and the 2-3 PCB output pad BR3 may be electrically connected to the 2-2 IC output pad ICR2.

The 2-5 PCB output pad BR5 is electrically connected to the 2-5 lower transmission pad FBR5, and the 2-5 upper transmission pad FAR5 connected to the 2-5 lower transmission pad FBR5 is electrically connected to the 2-5 PCB input pad AR5. The 2-6 PCB output pad BR6 is electrically connected to the 2-6 lower transmission pad FBR6, and the 2-6 upper transmission pad FAR6 connected to the 2-6 lower transmission pad FBR6 is electrically connected to the 2-6 PCB input pad AR6. Accordingly, the 2-5 PCB output pad BR5 may be electrically connected to the 2-5 PCB input pad AR5, and the 2-6 PCB output pad BR6 may be electrically connected to the 2-6 PCB input pad AR6.

Signal input pads such as a PCB signal input pad SA (see FIG. 2) and an IC signal input pad SC (see FIG. 2) are disposed on the display panel 10, a signal output pad such as a PCB signal output pad SB (see FIG. 2) are disposed on the printed circuit board 40, and a signal output pad such as an IC signal output pad ISC (see FIG. 2) are disposed on the integrated circuit chip 30. The PCB signal output pad SB may be electrically connected to a lower signal transmission pad FSB (see FIG. 3) of the flexible printed circuit board 20. The PCB signal input pad SA may be electrically connected to an upper signal transmission pad FSA (see FIG. 3) of the flexible printed circuit board 20. The lower signal transmission pad FSB may be connected to the upper signal transmission pad FSA. Accordingly, the PCB signal output pad SB of the printed circuit board 40 may be electrically connected to the PCB signal input pad SA of the display panel 10. The IC signal output pad ISC of the integrated circuit chip 30 may be electrically connected to the IC signal input pad SC of the display panel 10. A signal from the IC signal input pad SC may be applied to the data line 171 of the display panel. With such a connection, a connection resistance measurement circuit may be formed. Accordingly, a connection resistance between an IC input pad of the first IC input pad group IIPGL of the display panel 10 and an IC output pad of the integrated circuit chip 30 may be measured.

FIG. 4 is a conceptual view for describing measurement of connection resistance. As shown in FIG. 4, in an embodiment current I may be applied by electrically connecting a current source to the 1-1 PCB output pad BL1 and the 1-2 PCB output pad BL2, and a voltage V may be measured by electrically connecting a voltmeter to the 1-3 PCB output pad BL3 and the 1-4 PCB output pad BL4, to calculate connection resistance R using V/I. For example, since the 1-1 PCB output pad BL1, the 1-2 PCB output pad BL2, the 1-3 PCB output pad BL3, and the 1-4 PCB output pad BL4 are respectively connected to the 1-1 connection terminal TL1, the 1-2 connection terminal TL2, the 1-3 connection terminal TL3, and the 1-4 connection terminal TL4, current I may be applied by electrically connecting a current source to the 1-1 connection terminal TL1 and the 1-2 connection terminal TL2, and a voltage V may be measured by electrically connecting a voltmeter to the 1-3 connection terminal TL3 and the 1-4 connection terminal TL4, to calculate connection resistance R using V/I.

In an embodiment, a connection resistance between an IC input pad of the second IC input pad group IIPGR of the display panel 10 and an IC output pad of the integrated circuit chip 30 may be measured. For example, since the 2-1 PCB output pad BR1, the 2-2 PCB output pad BR2, the 2-3 PCB output pad BR3, and the 2-4 PCB output pad BR4 are respectively connected to the 2-1 connection terminal TR1, the 2-2 connection terminal TR2, the 2-3 connection terminal TR3, and the 2-4 connection terminal TR4, current I may be applied by electrically connecting a current source to the 2-1 connection terminal TR1 and the 2-2 connection terminal TR2, and a voltage V may be measured by electrically connecting a voltmeter to the 2-3 connection terminal TR3 and the 2-4 connection terminal TR4, to calculate connection resistance R using V/I. For example, in an embodiment connection resistance may be measured by using a 4-terminal resistance measurement method.

A connection resistance between a PCB input pad of the first PCB input pad group PIPGL of the display panel 10 and an upper transmission pad of the flexible printed circuit board 20 may also be measured. For example, in an embodiment current I may be applied by electrically connecting a current source to the 1-5 PCB output pad BL5 and the 1-6 PCB output pad BL6, and a voltage V may be measured by electrically connecting a voltmeter to the 1-5 PCB output pad BL5 and the 1-6 PCB output pad BL6, to calculate connection resistance R using V/I. For example, in an embodiment connection resistance may be measured by using a 2-terminal resistance measurement method. Also, current I may be applied by electrically connecting a current source to the 1-5 PCB output pad BL5 and the 2-6 PCB output pad BR6, and a voltage V may be measured by electrically connecting a voltmeter to the 1-5 PCB output pad BL5 and the 2-6 PCB output pad BR6. In this embodiment, a connection resistance between a PCB input pad of the first PCB input pad group PIPGL of the display panel 10 and an upper transmission pad of the flexible printed circuit board 20, and a connection resistance between a PCB input pad of the second PCB input pad group PIPGR and an upper transmission pad of the flexible printed circuit board 20 may be measured. Such connection terminals and PCB output pads may be electrically connected to measurement terminals located on the printed circuit board 40. For example, a plurality of PCB output pads electrically connected to a plurality of IC output pads may be electrically connected to a plurality of measurement terminals. In an embodiment, a plurality of PCB output pads electrically connected to a plurality of IC output pads may be electrically connected to some of a plurality of measurement terminals.

Figure 5:
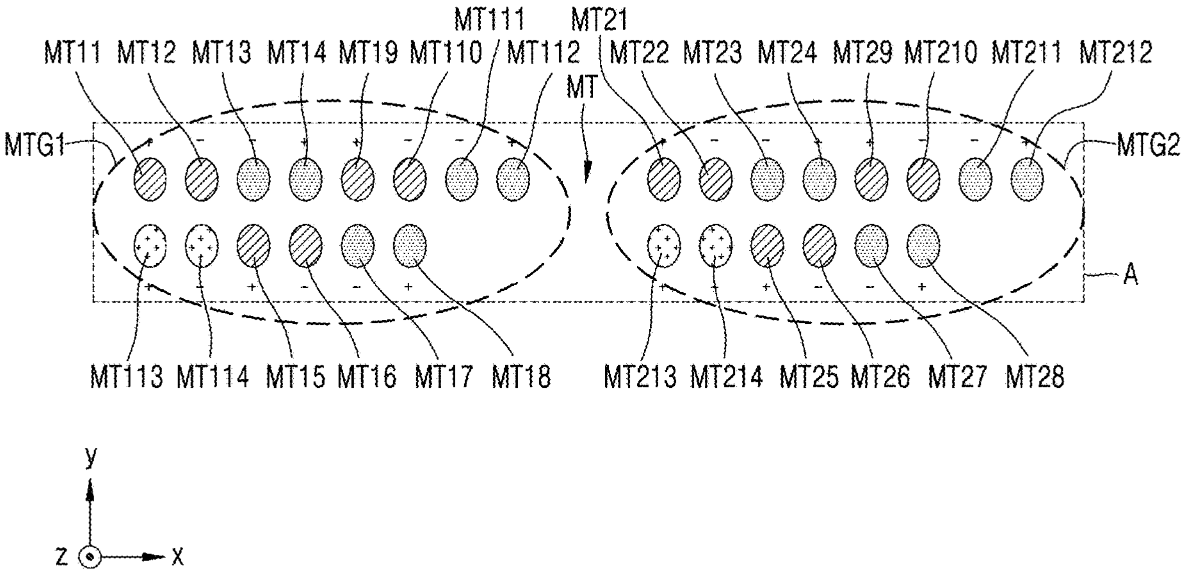
FIG. 5 is an enlarged view illustrating a portion "A" of FIG. 1 according to an embodiment of the present disclosure.

FIG. 5 is an enlarged plan view schematically illustrating a portion "A" of FIG. 1. As described above, the printed circuit board 40 may include the measurement terminal unit MT, and the measurement terminal unit may include a first measurement terminal group MTG1 and a second measurement terminal group MTG2. Each of the first measurement terminal group MTG1 and the second measurement terminal group MTG2 may include a plurality of measurement terminals. For example, in an embodiment the first measurement terminal group MTG1 may include a 1-1 measurement terminal MT11, a 1-2 measurement terminal MT12, a 1-3 measurement terminal MT13, a 1-4 measurement terminal MT14, a 1-5 measurement terminal MT15, a 1-6 measurement terminal MT16, a 1-7 measurement terminal MT17, a 1-8 measurement terminal MT18, a 1-9 measurement terminal MT19, a 1-10 measurement terminal MT110, a 1-11 measurement terminal MT111, a 1-12 measurement terminal MT112 a 1-13 measurement terminal MT113, and a 1-14 measurement terminal MT114. In an embodiment, the second measurement terminal group MTG2 may include a 2-1 measurement terminal MT21, a 2-2 measurement terminal MT22, a 2-3 measurement terminal MT23, a 2-4 measurement terminal MT24, a 2-5 measurement terminal MT25, a 2-6 measurement terminal MT26, a 2-7 measurement terminal MT27, a 2-8 measurement terminal MT28, a 2-9 measurement terminal MT29, a 2-10 measurement terminal MT210, a 2-11 measurement terminal MT211, a 2-12 measurement terminal MT212 a 2-13 measurement terminal MT213, and a 2-14 measurement terminal MT214. Each of measurement terminals of the measurement terminal unit MT may be electrically connected to a connection terminal or a PCB output pad. For example, in an embodiment one measurement terminal may be connected to one connection terminal or one PCB output pad through an internal wiring of the printed circuit board 40. However, embodiments of the present disclosure are not necessarily limited thereto.

Figure 6:
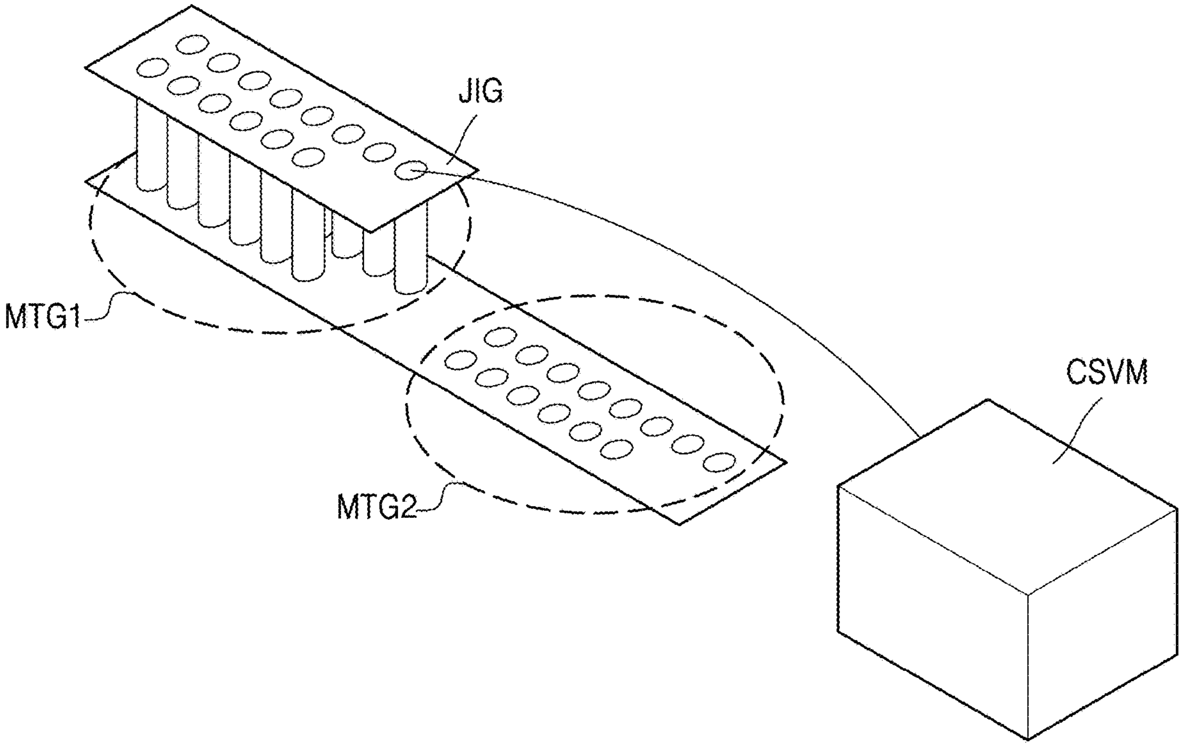
FIG. 6 is a schematic conceptual view for describing measurement of connection resistance in a display apparatus, according to an embodiment of the present disclosure.

FIG. 6 is a schematic conceptual view for describing measurement of connection resistance in a display apparatus, according to an embodiment. For example, in an embodiment shown in FIG. 6, connection resistance is measured by using one current source voltmeter CSVM. In an embodiment, the current source voltmeter CSVM is connected to one connection jig JIG, and the connection jig JIG include 14 probes. However, embodiments of the present disclosure are not necessarily limited thereto.

In an embodiment, considering measurement cost, measurement time, measurement efficiency, etc., the current source voltmeter CSVM may simultaneously measure up to four connection resistances. Accordingly, when a connection resistance between a pad of the display panel 10 and a pad of the flexible printed circuit board 20 and a connection resistance between a pad of the display panel 10 and a pad of the integrated circuit chip 30 are measured, up to three connection resistances between the pad of the display panel 10 and the pad of the integrated circuit chip 30 may be measured. Accordingly, in an embodiment the connection jig JIG includes 14 probes contacting 2 terminals for measuring connection resistance between the pad and the pad of the integrated circuit chip 30 and 12 terminals for measuring connection resistance between the pad of the display panel 10 and the pad of the integrated circuit chip 30. The 14 probes of the connection jig JIG may simultaneously contact a plurality of measurement terminals of the first measurement terminal group MTG1 arranged adjacent to each other, and the 14 probes of the connection jig JIG may simultaneously contact a plurality of measurement terminals of the second measurement terminal group MTG2 arranged adjacent to each other. Accordingly, multiple connection resistances may be simultaneously measured through two contacts.

However, since the display apparatus includes a plurality of integrated circuit chips 30 as described above, it is necessary to efficiently measure connection resistance. As described above, measurement terminals of the printed circuit board 40 may be electrically connected to connection terminals of the printed circuit board 40. Accordingly, electrical connection between measurement terminals and connection terminals of the printed circuit board 40 may vary according to the number of integrated circuit chips 30 provided in the display apparatus. Since a connection resistance between the pad of the display panel 10 and the pad of the integrated circuit chip 30 is measured by using a connection terminal of the PCB output pad unit POP electrically connected to the pad of the integrated circuit chip 30, the electrical connection between measurement terminals and connection terminals of the printed circuit board 40 may vary according to the number of PCB output pad units POP provided in the display apparatus.

Figure 7:
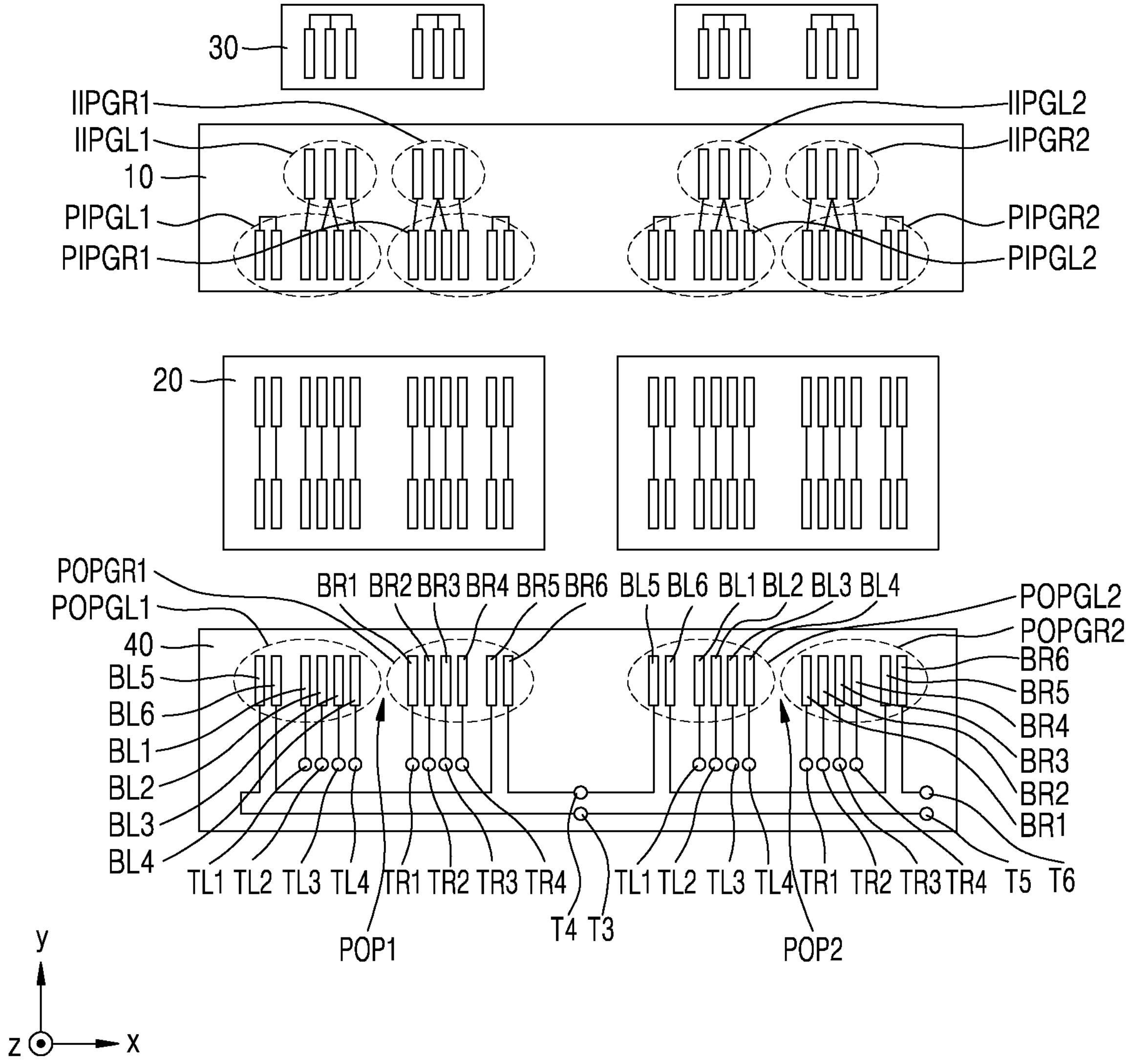
FIG. 7 is an exploded plan view schematically illustrating a portion of a display apparatus, according to an embodiment of the present disclosure.

FIG. 7 is an exploded plan view schematically illustrating a portion of a display apparatus, according to an embodiment. In FIG. 7, for convenience, a plurality of flexible printed circuit boards 20 are separated from the display panel 10 and the printed circuit board 40, and a plurality of integrated circuit chips 30 are separated from the display panel 10. In FIG. 7, only a portion (e.g., a portion in the −y direction) of the display panel 10 is illustrated, only a portion (e.g., a portion in the +y direction) of the printed circuit board 40 is illustrated, and the PCB signal input pad SA, the IC signal input pad SC, the PCB signal output pad SB, the IC signal output pad ISC, the lower signal transmission pad FSB, and the upper signal transmission pad FSA are not illustrated for economy of explanation.

As shown in FIG. 7, a plurality of PCB output pad units POP may include a first PCB output pad unit POP1 and a second PCB output pad unit POP2. In an embodiment, in a plan view, the first PCB output pad unit POP1 may be disposed adjacent to the first side S1 of the display panel 10, and in a plan view, the second PCB output pad unit POP2 may be located adjacent to the second side S2 facing the first side S1 of the display panel 10 (e.g., in the x-axis direction). For example, in an embodiment the display apparatus of FIG. 7 may include two PCB output pad units POP, and thus, the display apparatus of FIG. 7 may include two integrated circuit chips 30.

Hereinafter, for convenience of explanation, the first PCB output pad group POPGL included in the first PCB output pad unit POP1 is referred to as a 1-1 PCB output pad group POPGL1, and the second PCB output pad group POPGR included in the first PCB output pad unit POP1 is referred to as a 2-1 PCB output pad group POPGR1. The first PCB output pad group POPGL include in the second PCB output pad unit POP2 is referred to as a 1-2 PCB output pad group POPGL2, and the second PCB output pad group POPGR included in the second PCB output pad unit POP2 is referred to as a 2-2 PCB output pad group POPGR2. In an embodiment, in a plan view, the 1-1 PCB output pad group POPGL1 may be located closer to the first side S1 of the display panel 10 than the 2-1 PCB output pad group POPGR1, and in a plan view, the 1-2 PCB output pad group POPGL2 may be located closer to the first side S1 of the display panel 10 than the 2-2 PCB output pad group POPGR2.

Also, the first PCB input pad group PIPGL electrically connected to the 1-1 PCB output pad group POPGL1 is referred to as a 1-1 PCB input pad group PIPGL1, and the first IC input pad group IIPGL electrically connected to the 1-1 PCB output pad group POPGL1 is referred to as a 1-1 IC input pad group IIPGL1. The second PCB input pad group PIPGR electrically connected to the 2-1 PCB output pad group POPGR1 is referred to as a 2-1 PCB input pad group PIPGR1, and the second IC input pad group IIPGR electrically connected to the 2-1 PCB output pad group POPGR1 is referred to as a 2-1 IC input pad group IIPGR1.

The first PCB input pad group PIPGL electrically connected to the 1-2 PCB output pad group POPGL2 is referred to as a 1-2 PCB input pad group PIPGL2, and the first IC input pad group IIPGL electrically connected to the 1-2 PCB output pad group POPGL2 is referred to as a 1-2 IC input pad group IIPGL2. The second PCB input pad group PIPGR electrically connected to the 2-2 PCB output pad group POPGR2 is referred to as a 2-2 PCB input pad group PIPGR2, and the second IC input pad group IIPGR electrically connected to the 2-2 PCB output pad group POPGR2 is referred to as a 2-2 IC input pad group IIPGR2.

As described above, in an embodiment the 1-1 PCB output pad BL1 of the first PCB output pad group POPGL may be connected to the 1-1 connection terminal TL1, the 1-2 PCB output pad BL2 of the first PCB output pad group POPGL may be connected to the 1-2 connection terminal TL2, the 1-3 PCB output pad BL3 of the first PCB output pad group POPGL may be connected to the 1-3 connection terminal TL3, and the 1-4 PCB output pad BL4 of the first PCB output pad group POPGL may be connected to the 1-4 connection terminal TL4. The 2-1 PCB output pad BR1 of the second PCB output pad group POPGR may be connected to the 2-1 connection terminal TR1, the 2-2 PCB output pad BR2 of the second PCB output pad group POPGR may be connected to the 2-2 connection terminal TR2, the 2-3 PCB output pad BR3 of the second PCB output pad group POPGR may be connected to the 2-3 connection terminal TR3, and the 2-4 PCB output pad BR4 of the second PCB output pad group POPGR may be connected to the 2-4 connection terminal TR4.

Accordingly, a connection resistance between an IC input pad of the 1-1 IC input pad group IIPGL1 and an IC output pad of the integrated circuit chip 30 may be measured by using the 1-1 connection terminal TL1, the 1-2 connection terminal TL2, the 1-3 connection terminal TL3, and the 1-4 connection terminal TL4 electrically connected to PCB output pads of the 1-1 PCB output pad group POPGL1. A connection resistance between an IC input pad of the 2-1 IC input pad group IIPGR1 and an IC output pad of the integrated circuit chip 30 may be measured by using the 2-1 connection terminal TR1, the 2-2 connection terminal TR2, the 2-3 connection terminal TR3, and the 2-4 connection terminal TR4 electrically connected to PCB output pads of the 2-1 PCB output pad group POPGR1.

In an embodiment, a connection resistance between an IC input pad of the 1-2 IC input pad group IIPGL2 and an IC output pad of the integrated circuit chip 30 may be measured by using the 1-1 connection terminal TL1, the 1-2 connection terminal TL2, the 1-3 connection terminal TL3, and the 1-4 connection terminal TL4 electrically connected to PCB output pads of the 1-2 PCB output pad group POPGL2. A connection resistance between an IC input pad of the 2-2 IC input pad group IIPGR2 and an IC output pad of the integrated circuit chip 30 may be measured by using the 2-1 connection terminal TR1, the 2-2 connection terminal TR2, the 2-3 connection terminal TR3, and the 2-4 connection terminal TR4 electrically connected to PCB output pads of the 2-2 PCB output pad group POPGR2.

In an embodiment, the 1-5 PCB output pad BL5 of the 1-1 PCB output pad group POPGL1 may be connected to a third connection terminal T3, and the 1-6 PCB output pad BL6 of the 1-1 PCB output pad group POPGL1 may be connected to the 2-5 PCB output pad BR5 of the 2-1 PCB output pad group POPGR1. The 2-6 PCB output pad BR6 of the 2-1 PCB output pad group POPGR1 may be connected to a fourth connection terminal T4. The third connection terminal T3 may also be connected to a fifth connection terminal T5.

In an embodiment, the 1-5 PCB output pad BL5 of the 1-2 PCB output pad group POPGL2 may be connected to the fourth connection terminal T4. The 1-6 PCB output pad BL6 of the 1-2 PCB output pad group POPGL2 may be connected to the 2-5 PCB output pad BR5 of the 2-2 PCB output pad group POPGR2, and the 2-6 PCB output pad BR6 of the 2-2 PCB output pad group POPGR2 may be connected to a sixth connection terminal T6. As described above, the 1-5 PCB output pad BL5 and the 1-6 PCB output pad BL6 of the first PCB output pad group POPGL may be electrically connected to each other, and the 2-5 PCB output pad BR5 and the 2-6 PCB output pad BR6 of the second PCB output pad group POPGR may be electrically connected to each other.

Accordingly, in an embodiment connection resistance may be measured by using a 2-terminal resistance measurement method. For example, in an embodiment current I may be applied by electrically connecting a current source to the third connection terminal T3 and the fourth connection terminal T4, and a voltage V may be measured by electrically connecting a voltmeter to the third connection terminal T3 and the fourth connection terminal T4. Accordingly, a connection resistance between a PCB input pad of the 1-1 PCB input pad group PIPGL1 and an upper transmission pad of the flexible connection board 20 and a connection resistance between a PCB input pad of the 2-1 PCB input pad group PIPGR1 and an upper transmission pad of the flexible printed circuit board 20 may be measured. Alternatively, in an embodiment current I may be applied by electrically connecting a current source to the fifth connection terminal T5 and the sixth connection terminal T6, and a voltage V may be measured by electrically connecting a voltmeter to the fifth connection terminal T5 and the sixth connection terminal T6. Accordingly, a connection resistance between a PCB input pad of the 1-2 PCB input pad group PIPGL2 and an upper transmission pad of the flexible printed circuit board 20 and a connection resistance between a PCB input pad of the 2-2 PCB input pad group PIPGR2 and an upper transmission pad of the flexible printed circuit board 20 may be measured.

Such connection terminals and measurement terminals located on the printed circuit board 40 may be electrically connected to each other.

For example, in an embodiment the 1-1 measurement terminal MT11 may be electrically connected to the 1-1 connection terminal TL1 connected to the 1-1 PCB output pad BL1 of the 1-1 PCB output pad group POPGL1, and the 1-2 measurement terminal MT12 may be electrically connected to the 1-2 connection terminal TL2 connected to the 1-2 PCB output pad BL2 of the 1-1 PCB output pad group POPGL1. In an embodiment, the 1-3 measurement terminal MT13 may be electrically connected to the 1-3 connection terminal TL3 connected to the 1-3 PCB output pad BL3 of the 1-1 PCB output pad group POPGL1, and the 1-4 measurement terminal MT14 may be electrically connected to the 1-4 connection terminal TL4 connected to the 1-4 PCB output pad BL4 of the 1-1 PCB output pad group POPGL1. For example, PCB output pads of the 1-1 PCB output pad group POPGL1 electrically connected to IC output pads may be electrically connected to some of measurement terminals of the first measurement terminal group MTG1.

In an embodiment, the 1-5 measurement terminal MT15 may be electrically connected to the 2-1 connection terminal TR1 connected to the 2-1 PCB output pad BR1 of the 2-1 PCB output pad group POPGR1, and the 1-6 measurement terminal MT16 may be electrically connected to the 2-2 connection terminal TR2 connected to the 2-2 PCB output pad BR2 of the 2-1 PCB output pad group POPGR1. The 1-7 measurement terminal MT17 may be electrically connected to the 2-3 connection terminal TR3 connected to the 2-3 PCB output pad BR3 of the 2-1 PCB output pad group POPGR1, and the 1-8 measurement terminal MT18 may be electrically connected to the 2-4 connection terminal TR4 connected to the 2-4 PCB output pad BR4 of the 2-1 PCB output pad group POPGR1. For example, PCB output pads of the 2-1 PCB output pad group POPGR1 electrically connected to IC output pads may be electrically connected to some of measurement terminals of the first measurement terminal group MTG1.

In an embodiment, the 2-1 measurement terminal MT21 may be electrically connected to the 1-1 connection terminal TL1 connected to the 1-1 PCB output pad BL1 of the 1-2 PCB output pad group POPGL2, and the 2-2 measurement terminal MT22 may be electrically connected to the 1-2 connection terminal TL2 connected to the 1-2 PCB output pad BL2 of the 1-2 PCB output pad group POPGL2. The 2-3 measurement terminal MT23 may be electrically connected to the 1-3 connection terminal TL3 connected to the 1-3 PCB output pad BL3 of the 1-2 PCB output pad group POPGL2, and the 2-4 measurement terminal MT24 may be electrically connected to the 1-4 connection terminal TL4 connected to the 1-4 PCB output pad BL4 of the 1-2 PCB output pad group POPGL2. For example, PCB output pads of the 1-2 PCB output pad group POPGL2 electrically connected to IC output pads may be electrically connected to some of measurement terminals of the second measurement terminal group MTG2.

In an embodiment, the 2-5 measurement terminal MT25 may be electrically connected to the 2-1 connection terminal TR1 connected to the 2-1 PCB output pad BR1 of the 2-2 PCB output pad group POPGR2, and the 2-6 measurement terminal MT26 may be electrically connected to the 2-2 connection terminal TR2 connected to the 2-2 PCB output pad BR2 of the 2-2 PCB output pad group POPGR2. The 2-7 measurement terminal MT27 may be electrically connected to the 2-3 connection terminal TR3 connected to the 2-3 PCB output pad BR3 of the 2-2 PCB output pad group POPGR2, and the 2-8 measurement terminal MT28 may be electrically connected to the 2-4 connection terminal TR4 connected to the 2-4 PCB output pad BR4 of the 2-2 PCB output pad group POPGR2. For example, PCB output pads of the 2-2 PCB output pad group POPGR2 connected to IC output pads may be electrically connected to some of measurement terminals of the second measurement terminal group MTG2.

In an embodiment, the 1-13 measurement terminal MT113 may be electrically connected to the third connection terminal T3, and the 1-14 measurement terminal MT114 may be electrically connected to the fourth connection terminal T4. The 2-13 measurement terminal MT213 may be electrically connected to the fifth connection terminal T5, and the 2-14 measurement terminal MT214 may be electrically connected to the sixth connection terminal T6. In an embodiment, as shown in FIG. 7, in which the display apparatus includes only two integrated circuit chips 30, the first measurement terminal group MTG1 may not include the 1-9 measurement terminal MT19, the 1-10 measurement terminal MT110, the 1-11 measurement terminal MT111, and the 1-12 measurement terminal MT112. Also, the second measurement terminal group MTG2 may not include the 2-9 measurement terminal MT29, the 2-10 measurement terminal MT210, the 2-11 measurement terminal MT211, and the 2-12 measurement terminal MT212.

Accordingly, as described with reference to FIG. 6, multiple connection resistances may be simultaneously measured through two contacts by using one current source voltmeter CSVM. For example, in an embodiment both connection resistance between PCB input pads of the display panel 10 and upper transmission pads of the flexible printed circuit boards 20 and connection resistance between IC input pads of the display panel 10 and IC output pads of the integrated circuit chips 30 may be measured. Accordingly, bonding quality between the display panel 10 and the flexible printed circuit board 20 and bonding quality between the display panel 10 and the integrated circuit chip 30 may be easily checked.

Figure 8:
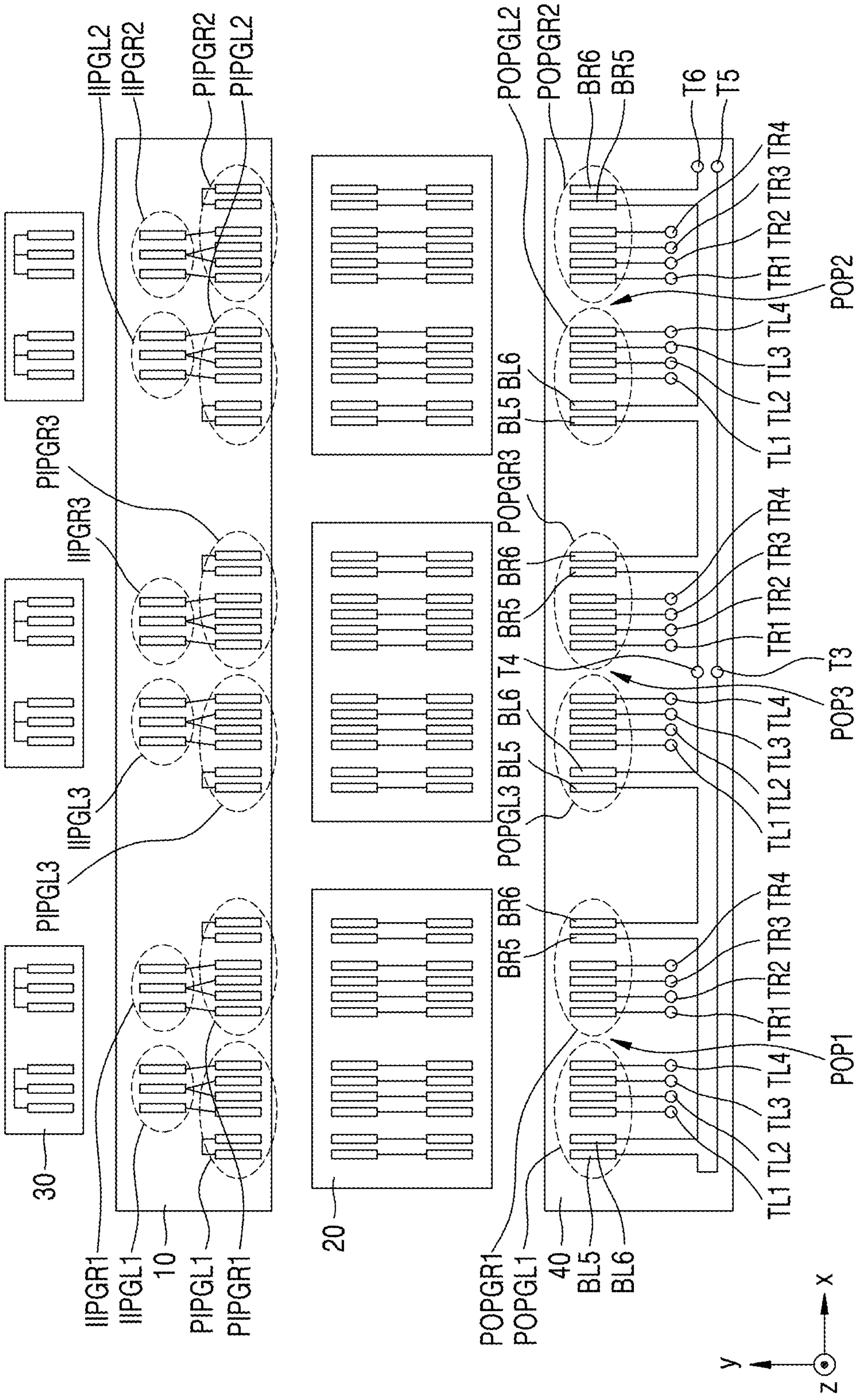
FIG. 8 is an exploded plan view schematically illustrating a portion of a display apparatus, according to an embodiment of the present disclosure.

FIG. 8 is an exploded plan view schematically illustrating a portion of a display apparatus, according to an embodiment. In FIG. 8, for convenience, a plurality of flexible printed circuit boards 20 are separated from the display panel 10 and the printed circuit board 40, and a plurality of integrated circuit chips 30 are separated from the display panel 10. In FIG. 8, only a portion (e.g., a portion in the −y direction) of the display panel 10 is illustrated, only a portion (e.g., a portion in the +y direction) of the printed circuit board 40 is illustrated, and the PCB signal input pad SA, the IC signal input pad SC, the PCB signal output pad SB, the IC signal output pad ISC, the lower signal transmission pad FSB, and the upper signal transmission pad FSA are not illustrated for convenience of explanation.

As shown in FIG. 8, in an embodiment a plurality of PCB output pad units POP may include a third PCB output pad unit POP3. The third PCB output pad unit POP3 may be disposed between the first PCB output pad unit POP1 and the second PCB output pad unit POP2 (e.g., in the x-axis direction). For example, in an embodiment the display apparatus of FIG. 8 may include three PCB output pad units POP, and thus, the display apparatus of FIG. 7 may include three integrated circuit chips 30.

Hereinafter, for convenience of explanation, the first PCB output pad group POPGL included in the third PCB output pad unit POP3 is referred to as a 1-3 PCB output pad group POPGL3, and the second PCB output pad group POPGR included in the third PCB output pad unit POP3 is referred to as a 2-3 PCB output pad group POPGR3. In an embodiment, in a plan view, the 1-3 PCB output pad group POPGL3 may be located closer to the first side S1 of the display panel 10 than the 2-3 PCB output pad group POPGR3.

Also, the first PCB input pad group PIPGL electrically connected to the 1-3 PCB output pad group POPGL3 is referred to as a 1-3 PCB input pad group PIPGL3, and the first IC input pad group IIPGL electrically connected to the 1-3 PCB output pad group POPGL3 is referred to as a 1-3 IC input pad group IIPGL3. The second PCB input pad group PIPGR electrically connected to the 2-3 PCB output pad group POPGR3 is referred to as a 2-3 PCB input pad group PIPGR3, and the second IC input pad group IIPGR electrically connected to the 2-3 PCB output pad group POPGR3 is referred to as a 2-3 IC input pad group IIPGR3.

Accordingly, in an embodiment a connection resistance between an IC input pad of the 1-3 IC input pad group IIPGL3 and an IC output pad of the integrated circuit chip 30 may be measured by using the 1-1 connection terminal TL1, the 1-2 connection terminal TL2, the 1-3 connection terminal TL3, and the 1-4 connection terminal TL4 electrically connected to PCB output pads of the 1-3 PCB output pad group POPGL3. A connection resistance between an IC input pad of the 2-3 IC input pad group IIPGR3 and an IC output pad of the integrated circuit chip 30 may be measured by using the 2-1 connection terminal TR1, the 2-2 connection terminal TR2, the 2-3 connection terminal TR3, and the 2-4 connection terminal TR4 electrically connected to PCB output pads of the 2-3 PCB output pad group POPGR3.

In an embodiment, the 1-5 PCB output pad BL5 of the 1-1 PCB output pad group POPGL1 may be connected to the third connection terminal T3, and the 1-6 PCB output pad BL6 of the 1-1 PCB output pad group POPGL1 may be connected to the 2-5 PCB output pad BR5 of the 2-1 PCB output pad group POPGR1. The 2-6 PCB output pad BR6 of the 2-1 PCB output pad group POPGR1 may be connected to the 1-5 PCB output pad BL5 of the 1-3 PCB output pad group POPGL3, and the 1-6 PCB output pad BL6 of the 1-3 PCB output pad group POPGL3 may be connected to the fourth connection terminal T4. The third connection terminal T3 may be connected to the fifth connection terminal T5.

In an embodiment, the 2-5 PCB output pad BR5 of the 2-3 PCB output pad group POPGR3 may be connected to the fourth connection terminal T4. The 2-6 PCB output pad BR6 of the 2-3 PCB output pad group POPGR3 may be connected to the 1-5 PCB output pad BL5 of the 1-2 PCB output pad group POPGL2. The 1-6 PCB output pad BL6 of the 1-2 PCB output pad group POPGL2 may be connected to the 2-5 PCB output pad BR5 of the 2-2 PCB output pad group POPGR2, and the 2-6 PCB output pad BR6 of the 2-2 PCB output pad group POPGR2 may be connected to the sixth connection terminal T6.

In this embodiment, current I may be applied by electrically connecting a current source to the third connection terminal T3 and the fourth connection terminal T4, and a voltage V may be measured by electrically connecting a voltmeter to the third connection terminal T3 and the fourth connection terminal T4. Accordingly, a connection resistance between a PCB input pad of the 1-1 PCB input pad group PIPGL1 and an upper transmission pad of the flexible printed circuit board 20, a connection resistance between a PCB input pad of the 2-1 PCB input pad group PIPGR1 and an upper transmission pad of the flexible printed circuit board 20, and a connection resistance between a PCB input pad of the 1-3 PCB input pad group PIPGL3 and an upper transmission pad of the flexible printed circuit board 20 may be measured. Alternatively, in an embodiment current I may be applied by electrically connecting a current source to the fifth connection terminal T5 and the sixth connection terminal T6, and a voltage V may be measured by electrically connecting a voltmeter to the fifth connection terminal T5 and the sixth connection terminal T6. Accordingly, a connection resistance between a PCB input pad of the 2-3 PCB input pad group PIPGR3 and an upper transmission pad of the flexible printed circuit board 20, a connection resistance between a PCB input pad of the 1-2 PCB input pad group PIPGL2 and an upper transmission pad of the flexible printed circuit board 20, and a connection resistance between a PCB input pad of the 2-2 PCB input pad group PIPGR2 and an upper transmission pad of the flexible printed circuit board 20 may be measured.

Such connection terminals and measurement terminals located on (e.g., disposed thereon) the printed circuit board 40 may be electrically connected to each other. The display apparatus according to the present embodiment includes a different number of integrated circuit chips 30 from the display apparatus described with reference to FIG. 7. Accordingly, the display apparatus according to the present embodiment may have electrical connection between connection terminals and measurement terminals of the printed circuit board 40, which is different from that that of the display apparatus described with reference to FIG. 7.

For example, in an embodiment the 1-1 measurement terminal MT11 may be electrically connected to the 1-1 connection terminal TL1 connected to the 1-1 PCB output pad BL1 of the 1-1 PCB output pad group POPGL1, and the 1-2 measurement terminal MT12 may be electrically connected to the 1-2 connection terminal TL2 connected to the 1-2 PCB output pad BL2 of the 1-1 PCB output pad group POPGL1. The 1-3 measurement terminal MT13 may be electrically connected to the 1-3 connection terminal TL3 connected to the 1-3 PCB output pad BL3 of the 1-1 PCB output pad group POPGL1, and the 1-4 measurement terminal MT14 may be electrically connected to the 1-4 connection terminal TL4 connected to the 1-4 PCB output pad BL4 of the 1-1 PCB output pad group POPGL1. For example, in an embodiment PCB output pads of the 1-1 PCB output pad group POPGL1 electrically connected to IC output pads may be electrically connected to some of measurement terminals of the first measurement terminal group MTG1.

In an embodiment, the 1-5 measurement terminal MT15 may be electrically connected to the 2-1 connection terminal TR1 connected to the 2-1 PCB output pad BR1 of the 2-1 PCB output pad group POPGR1, and the 1-6 measurement terminal MT16 may be electrically connected to the 2-2 connection terminal TR2 connected to the 2-2 PCB output pad BR2 of the 2-1 PCB output pad group POPGR1. The 1-7 measurement terminal MT17 may be electrically connected to the 2-3 connection terminal TR3 connected to the 2-3 PCB output pad BR3 of the 2-1 PCB output pad group POPGR1, and the 1-8 measurement terminal MT18 may be electrically connected to the 2-4 connection terminal TR4 connected to the 2-4 PCB output pad BR4 of the 2-1 PCB output pad group POPGR1. For example, in an embodiment PCB output pads of the 2-1 PCB output pad group POPGR1 electrically connected to IC output pads may be electrically connected to some of measurement terminals of the first measurement terminal group MTG1.

In an embodiment, the 1-9 measurement terminal MT19 may be electrically connected to the 1-1 connection terminal TL1 connected to the 1-1 PCB output pad BL1 of the 1-3 PCB output pad group POPGL3, and the 1-10 measurement terminal MT110 may be electrically connected to the 1-2 connection terminal TL2 connected to the 1-2 PCB output pad BL2 of the 1-3 PCB output pad group POPGL3. The 1-11 measurement terminal MT111 may be electrically connected to the 1-3 connection terminal TL3 connected to the 1-3 PCB output pad BL3 of the 1-3 PCB output pad group POPGL3, and the 1-12 measurement terminal MT112 may be electrically connected to the 1-4 connection terminal TL4 connected to the 1-4 PCB output pad BL4 of the 1-3 PCB output pad group POPGL3. For example, in an embodiment PCB output pads of the 1-3 PCB output pad group POPGL3 electrically connected to IC output pads may be electrically connected to some of measurement terminals of the first measurement terminal group MTG1.

In an embodiment, the 2-1 measurement terminal MT21 may be electrically connected to the 2-1 connection terminal TR1 connected to the 2-1 PCB output pad BR1 of the 2-3 PCB output pad group POPGR3, and the 2-2 measurement terminal MT22 may be electrically connected to the 2-2 connection terminal TR2 connected to the 2-2 PCB output pad BR2 of the 2-3 PCB output pad group POPGR3. The 2-3 measurement terminal MT23 may be electrically connected to the 2-3 connection terminal TR3 connected to the 2-3 PCB output pad BR3 of the 2-3 PCB output pad group POPGR3, and the 2-4 measurement terminal MT24 may be electrically connected to the 2-4 connection terminal TR4 connected to the 2-4 PCB output pad BR4 of the 2-3 PCB output pad group POPGR3. For example, in an embodiment PCB output pads of the 2-3 PCB output pad group POPGR3 electrically connected to IC output pads may be electrically connected to some of measurement terminals of the second measurement terminal group MTG2.

In an embodiment, the 2-5 measurement terminal MT25 may be electrically connected to the 1-1 connection terminal TL1 connected to the 1-1 PCB output pad BL1 of the 1-2 PCB output pad group POPGL2, and the 2-6 measurement terminal MT26 may be electrically connected to the 1-2 connection terminal TL2 connected to the 1-2 PCB output pad BL2 of the 1-2 PCB output pad group POPGL2. The 2-7 measurement terminal MT27 may be electrically connected to the 1-3 connection terminal TL3 connected to the 1-3 PCB output pad BL3 of the 1-2 PCB output pad group POPGL2, and the 2-8 measurement terminal MT28 may be electrically connected to the 1-4 connection terminal TL4 connected to the 1-4 PCB output pad BL4 of the 1-2 PCB output pad group POPGL2. For example, in an embodiment PCB output pads of the 1-2 PCB output pad group POPGL2 electrically connected to IC output pads may be electrically connected to some of measurement terminals of the second measurement terminal group MTG2.

In an embodiment, the 2-9 measurement terminal MT29 may be electrically connected to the 2-1 connection terminal TR1 connected to the 2-1 PCB output pad BR1 of the 2-2 PCB output pad group POPGR2, and the 2-10 measurement terminal MT210 may be electrically connected to the 2-2 connection terminal TR2 connected to the 2-2 PCB output pad BR2 of the 2-2 PCB output pad group POPGR2. The 2-11 measurement terminal MT211 may be electrically connected to the 2-3 connection terminal TR3 connected to the 2-3 PCB output pad BR3 of the 2-2 PCB output pad group POPGR2, and the 2-12 measurement terminal MT212 may be electrically connected to the 2-4 connection terminal TR4 connected to the 2-4 PCB output pad BR4 of the 2-2 PCB output pad group POPGR2. For example, in an embodiment PCB output pads of the 2-2 PCB output pad group POPGR2 electrically connected to IC output pads may be electrically connected to some of measurement terminals of the second measurement terminal group MTG2.

In an embodiment, the 1-13 measurement terminal MT113 may be electrically connected to the third connection terminal T3, and the 1-14 measurement terminal MT114 may be electrically connected to the fourth connection terminal T4. The 2-13 measurement terminal MT213 may be electrically connected to the fifth connection terminal T5, and the 2-14 measurement terminal MT214 may be electrically connected to the sixth connection terminal T6.

Accordingly, as described with reference to FIG. 6, multiple connection resistances may be simultaneously measured through two contacts by using one current source voltmeter CSVM. For example, in an embodiment both connection resistance between PCB input pads of the display panel 10 and upper transmission pads of the flexible printed circuit boards 20 and connection resistance between IC input pads of the display panel 10 and IC output pads of the integrated circuit chips 30 may be measured. Accordingly, bonding quality between the display panel 10 and the flexible printed circuit board 20 and bonding quality between the display panel 10 and the integrated circuit chip 30 may be easily checked.

Figure 9:
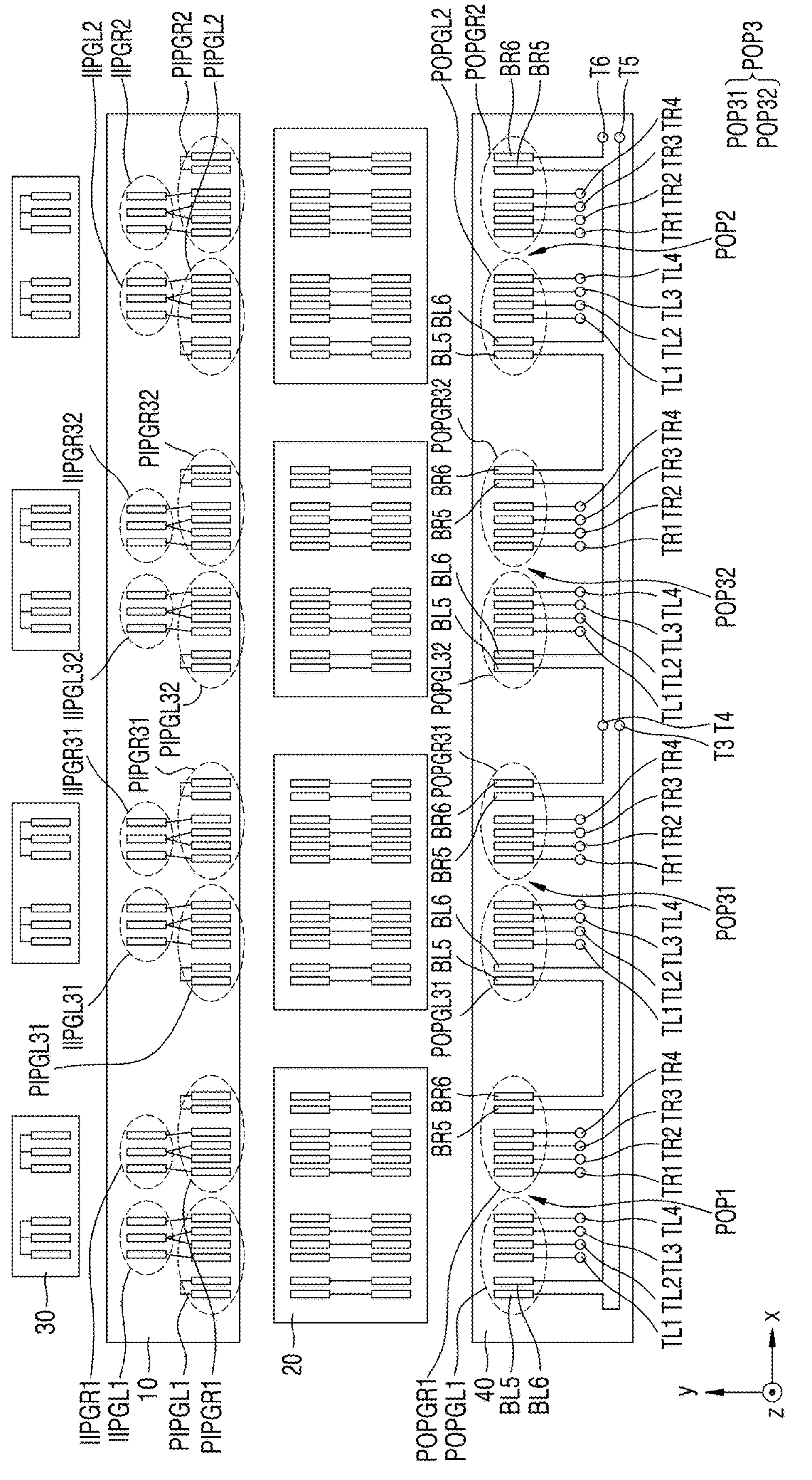
FIG. 9 is an exploded plan view schematically illustrating a portion of a display apparatus, according to an embodiment of the present disclosure.

FIG. 9 is an exploded plan view schematically illustrating a portion of a display apparatus, according to an embodiment. In FIG. 9, for convenience, a plurality of flexible printed circuit boards 20 are separated from the display panel 10 and the printed circuit board 40, and a plurality of integrated circuit chips 30 are separated from the display panel 10. In FIG. 9, only a portion (e.g., a portion in the −y direction) of the display panel 10 is illustrated, only a portion (e.g., a portion in the +y direction) of the printed circuit board 40 is illustrated, and the PCB signal input pad SA, the IC signal input pad SC, the PCB signal output pad SB, the IC signal output pad ISC, the lower signal transmission pad FSB, and the upper signal transmission pad FSA are not illustrated for convenience of explanation.

As shown in FIG. 9, in an embodiment the third PCB output pad unit POP3 may include a 3-1 PCB output pad unit POP31 and a 3-2 PCB output pad unit POP32. The 3-1 PCB output pad unit POP31 may be disposed adjacent to the first PCB output pad unit POP1, and the 3-2 PCB output pad unit POP32 may be disposed adjacent to the second PCB output pad unit POP2. For example, in an embodiment the display apparatus of FIG. 9 may include four PCB output pad units, and thus, the display apparatus of FIG. 9 may include four flexible printed circuit boards 20.

Hereinafter, for convenience of explanation, the first PCB output pad group POPGL included in the 3-1 PCB output pad unit POP31 is referred to as a 1-3-1 PCB output pad group POPGL31, and the second PCB output pad group POPGR included in the 3-1 PCB output pad unit POP31 is referred to as a 2-3-1 PCB output pad group POPGR31. The first PCB output pad group POPGL included in the 3-2 PCB output pad unit POP32 is referred to as a 1-3-2 PCB output pad group POPGL32, and the second PCB output pad group POPGR included in the 3-2 PCB output pad unit POP32 is referred to as a 2-3-2 PCB output pad group POPGR32. In a plan view, the 1-3-1 PCB output pad group POPGL31 may be disposed closer to the first side S1 of the display panel 10 than the 2-1 PCB output pad group POPGR1 (e.g., in an x-axis direction), and in a plan view, the 1-2 PCB output pad group POPGL2 may be located closer to the first side S1 of the display panel 10 than the 2-2 PCB output pad group POPGR2 (e.g., in an x-axis direction).

Also, the first PCB input pad group PIPGL electrically connected to the 1-3-1 PCB output pad group POPGL31 is referred to as a 1-3-1 PCB input pad group PIPGL31, and the first IC input pad group IIPGL electrically connected to the 1-3-1 PCB output pad group POPGL31 is referred to as a 1-3-1 IC input pad group IIPGL31. The second PCB input pad group PIPGR electrically connected to the 2-3-1 PCB output pad group POPGR31 is referred to a 2-3-1 PCB input pad group PIPGR31, and the second IC input pad group IIPGR electrically connected to the 2-3-1 PCB output pad group POPGR31 is referred to as a 2-3-1 IC input pad group IIPGR31.

The first PCB input pad group PIPGL electrically connected to the 1-3-2 PCB output pad group POPGL32 is referred to as a 1-3-2 PCB input pad group PIPGL32, and the first IC input pad group IIPGL electrically connected to the 1-3-2 PCB output pad group POPGL32 is referred to as a 1-3-2 IC input pad group IIPGL32. The second PCB input pad group PIPGR electrically connected to the 2-3-2 PCB output pad group POPGR32 is referred to as a 2-3-2 PCB input pad group PIPGR32, and the second IC input pad group IIPGR electrically connected to the 2-3-2 PCB output pad group POPGR32 is referred to as a 2-3-2 IC input pad group IIPGR32.

Accordingly, in an embodiment a connection resistance between an IC input pad of the 1-3-1 IC input pad group IIPGL31 and an IC output pad of the integrated circuit chip 30 may be measured by using the 1-1 connection terminal TL1, the 1-2 connection terminal TL2, the 1-3 connection terminal TL3, and the 1-4 connection terminal TL4 electrically connected to PCB output pads of the 1-3-1 PCB output pad group POPGL31. A connection resistance between an IC input pad of the 2-3-1 IC input pad group IIPGR31 and an IC output pad of the integrated circuit chip 30 may be measured by using the 2-1 connection terminal TR1, the 2-2 connection terminal TR2, the 2-3 connection terminal TR3, and the 2-4 connection terminal TR4 electrically connected to PCB output pads of the 2-3-1 PCB output pad group POPGR31.

In an embodiment, a connection resistance between an IC input pad of the 1-3-2 IC input pad group IIPGL32 and an IC output pad of the integrated circuit chip 30 may be measured by using the 1-1 connection terminal TL1, the 1-2 connection terminal TL2, the 1-3 connection terminal TL3, and the 1-4 connection terminal TL4 electrically connected to PCB output pads of the 1-3-2 PCB output pad group POPGL32. A connection resistance between an IC input pad of the 2-3-2 IC input pad group IIPGR32 and an IC output pad of the integrated circuit chip 30 may be measured by using the 2-1 connection terminal TR1, the 2-2 connection terminal TR2, the 2-3 connection terminal TR3, and the 2-4 connection terminal TR4 electrically connected to PCB output pads of the 2-3-2 PCB output pad group POPGR32.

In an embodiment, the 1-5 PCB output pad BL5 of the 1-1 PCB output pad group POPGL1 may be connected to the third connection terminal T3, and the 1-6 PCB output pad BL6 of the 1-1 PCB output pad group POPGL1 may be connected to the 2-5 PCB output pad BR5 of the 2-1 PCB output pad group POPGR1. The 2-6 PCB output pad BR6 of the 2-1 PCB output pad group POPGR1 may be connected to the 1-5 PCB output pad BL5 of the 1-3-1 PCB output pad group POPGL31, and the 1-6 PCB output pad BL6 of the 1-3-1 PCB output pad group POPGL31 may be connected to the 2-5 PCB output pad BR5 of the 2-3-1 PCB output pad group POPGR31. The 2-6 PCB output pad BR6 of the 2-3-1 PCB output pad group POPGR31 may be connected to the fourth connection terminal T4. The third connection terminal T3 may also be connected to the fifth connection terminal T5.

In an embodiment, the 1-5 PCB output pad BL5 of the 1-3-2 PCB output pad group POPGL32 may be connected to the fourth connection terminal T4. The 1-6 PCB output pad BL6 of the 1-3-2 PCB output pad group POPGL32 may be connected to the 2-5 PCB output pad BR5 of the 2-3-2 PCB output pad group POPGR32, and the 2-6 PCB output pad BR6 of the 2-3-2 PCB output pad group POPGR32 may be connected to the 1-5 PCB output pad BL5 of the 1-2 PCB output pad group POPGL2. The 1-6 PCB output pad BL6 of the 1-2 PCB output pad group POPGL2 may be connected to the 2-5 PCB output pad BR5 of the 2-2 PCB output pad group POPGR2, and the 2-6 PCB output pad BR6 of the 2-2 PCB output pad group POPGR2 may be connected to the sixth connection terminal T6.

In this embodiment, current I may be applied by electrically connecting a current source to the third connection terminal T3 and the fourth connection terminal T4, and a voltage V may be measured by electrically connecting a voltmeter to the third connection terminal T3 and the fourth connection terminal T4. Accordingly, a connection resistance between a PCB input pad of the 1-1 PCB input pad group PIPGL1 and an upper transmission pad of the flexible printed circuit board 20 and a connection resistance between a PCB input pad of the 2-1 PCB input pad group PIPGR1 and an upper transmission pad of the flexible printed circuit board 20 may be measured. A connection resistance between a PCB input pad of the 1-3-1 PCB input pad group PIPGL31 and an upper transmission pad of the flexible printed circuit board 20 and a connection resistance between a PCB input pad of the 2-3-1 PCB input pad group PIPGR31 and an upper transmission pad of the flexible printed circuit board 20 may be measured.

Alternatively, in an embodiment current I may be applied by electrically connecting a current source to the fifth connection terminal T5 and the sixth connection terminal T6, and a voltage V may be measured by electrically connecting a voltmeter to the fifth connection terminal T5 and the sixth connection terminal T6. Accordingly, a connection resistance between a PCB input pad of the 1-3-2 PCB input pad group PIPGL32 and an upper transmission pad of the flexible printed circuit board 20 and a connection resistance between a PCB input pad of the 2-3-2 PCB input pad group PIPGR32 and an upper transmission pad of the flexible printed circuit board 20 may be measured. In an embodiment, a connection resistance between a PCB input pad of the 1-2 PCB input pad group PIPGL2 and an upper transmission pad of the flexible printed circuit board 20 and a connection resistance between a PCB input pad of the 2-2 PCB input pad group PIPGR2 and an upper transmission pad of the flexible printed circuit board 20 may be measured.

Such connection terminals and measurement terminals located on (e.g., disposed thereon) the printed circuit board 40 may be electrically connected to each other. The display apparatus according to the present embodiment may include more integrated circuit chips than the display apparatus described with reference to FIG. 8. Accordingly, the display apparatus according to the present embodiment may have electrical connection between connection terminals and measurement terminals of the printed circuit board 40, which is different from that of the display apparatus described with reference to FIG. 8. For example, some of measurement terminals of the printed circuit board 40 may not be electrically connected to connection terminals.

Like in an embodiment of FIG. 8, even in an embodiment of FIG. 9, the 1-1 measurement terminal MT11 may be electrically connected to the 1-1 connection terminal TL1 connected to the 1-1 PCB output pad BL1 of the 1-1 PCB output pad group POPGL1, and the 1-2 measurement terminal MT12 may be electrically connected to the 1-2 connection terminal TL2 connected to the 1-2 PCB output pad BL2 of the 1-1 PCB output pad group POPGL1. The 1-3 measurement terminal MT13 may be electrically connected to the 1-3 connection terminal TL3 connected to the 1-3

PCB output pad BL3 of the 1-1 PCB output pad group POPGL1, and the 1-4 measurement terminal MT14 may be electrically connected to the 1-4 connection terminal TL4 connected to the 1-4 PCB output pad BL4 of the 1-1 PCB output pad group POPGL1. For example, even in the present embodiment, PCB output pads of the 1-1 PCB output pad group POPGL1 electrically connected to IC output pads may be electrically connected to some of measurement terminals of the first measurement terminal group MTG1.

In an embodiment, the 1-5 measurement terminal MT15 may be electrically connected to the 2-1 connection terminal TR1 connected to the 2-1 PCB output pad BR1 of the 2-1 PCB output pad group POPGR1, and the 1-6 measurement terminal MT16 may be electrically connected to the 2-2 connection terminal TR2 connected to the 2-2 PCB output pad BR2 of the 2-1 PCB output pad group POPGR1. The 1-7 measurement terminal MT17 may be electrically connected to the 2-3 connection terminal TR3 connected to the 2-3 PCB output pad BR3 of the 2-1 PCB output pad group POPGR1, and the 1-8 measurement terminal MT18 may be electrically connected to the 2-4 connection terminal TR4 connected to the 2-4 PCB output pad BR4 of the 2-1 PCB output pad group POPGR1. For example, even in the present embodiment, PCB output pads of the 2-1 PCB output pad group POPGR1 electrically connected to IC output pads may be electrically connected to some of measurement terminals of the first measurement terminal group MTG1.

In an embodiment, the 2-5 measurement terminal MT25 may be electrically connected to the 1-1 connection terminal TL1 connected to the 1-1 PCB output pad BL1 of the 1-2 PCB output pad group POPGL2, and the 2-6 measurement terminal MT26 may be electrically connected to the 1-2 connection terminal TL2 connected to the 1-2 PCB output pad BL2 of the 1-2 PCB output pad group POPGL2. The 2-7 measurement terminal MT27 may be electrically connected to the 1-3 connection terminal TL3 connected to the 1-3 PCB output pad BL3 of the 1-2 PCB output pad group POPGL2, and the 2-8 measurement terminal MT28 may be electrically connected to the 1-4 connection terminal TL4 connected to the 1-4 PCB output pad BL4 of the 1-2 PCB output pad group POPGL2. For example, even in the present embodiment, PCB output pads of the 1-2 PCB output pad group POPGL2 electrically connected to IC output pads may be electrically connected to some of measurement terminals of the second measurement terminal group MTG2.

In an embodiment, the 2-9 measurement terminal MT29 may be electrically connected to the 2-1 connection terminal TR1 connected to the 2-1 PCB output pad BR1 of the 2-2 PCB output pad group POPGR2, and the 2-10 measurement terminal MT210 may be electrically connected to the 2-2 connection terminal TR2 connected to the 2-2 PCB output pad BR2 of the 2-2 PCB output pad group POPGR2. The 2-11 measurement terminal MT211 may be electrically connected to the 2-3 connection terminal TR3 connected to the 2-3 PCB output pad BR3 of the 2-2 PCB output pad group POPGR2, and the 2-12 measurement terminal MT212 may be electrically connected to the 2-4 connection terminal TR4 connected to the 2-4 PCB output pad BR4 of the 2-2 PCB output pad group POPGR2. For example, even in the present embodiment, PCB output pads of the 2-2 PCB output pad group POPGR2 electrically connected to IC output pads may be electrically connected to some of measurement terminals of the second measurement terminal group MTG2.

However, in an embodiment of FIG. 9, the 1-9 measurement terminal MT19 may be electrically connected to the 1-1 connection terminal TL1 connected to the 1-1 PCB output pad BL1 of the 1-3-1 PCB output pad group POPGL31, and the 1-10 measurement terminal MT110 may be electrically connected to the 1-2 connection terminal TL2 connected to the 1-2 PCB output pad BL2 of the 1-3-1 PCB output pad group POPGL31. The 1-11 measurement terminal MT111 may be electrically connected to the 1-3 connection terminal TL3 connected to the 1-3 PCB output pad BL3 of the 1-3-1 PCB output pad group POPGL31, and the 1-12 measurement terminal MT112 may be electrically connected to the 1-4 connection terminal TL4 connected to the 1-4 connection terminal TL4 of the 1-3-1 PCB output pad group POPGL31. For example, in the present embodiment, PCB output pads of the 1-3-1 PCB output pad group POPGL31 electrically connected to IC output pads may be electrically connected to some of measurement terminals of the first measurement terminal group MTG1.

In an embodiment, the 2-1 measurement terminal MT21 may be electrically connected to the 2-1 connection terminal TR1 connected to the 2-1 PCB output pad BR1 of the 2-3-2 PCB output pad group POPGR32, and the 2-2 measurement terminal MT22 may be electrically connected to the 2-2 connection terminal TR2 connected to the 2-2 PCB output pad BR2 of the 2-3-2 PCB output pad group POPGR32. In an embodiment, the 2-3 measurement terminal MT23 may be electrically connected to the 2-3 connection terminal TR3 connected to the 2-3 PCB output pad BR3 of the 2-3-2 PCB output pad group POPGR32, and the 2-4 measurement terminal MT24 may be electrically connected to the 2-4 connection terminal TR4 connected to the 2-4 PCB output pad BR4 of the 2-3-2 PCB output pad group POPGR32. For example, in an embodiment PCB output pads of the 2-3-2 PCB output pad group POPGR32 electrically connected to IC output pads may be electrically connected to some of measurement terminals of the second measurement terminal group MTG2.

Like in an embodiment of FIG. 8, even in an embodiment of FIG. 9, the 1-13 measurement terminal MT113 may be electrically connected to the third connection terminal T3, and the 1-14 measurement terminal MT114 may be electrically connected to the fourth connection terminal T4. The 2-13 measurement terminal MT213 may be electrically connected to the fifth connection terminal T5, and the 2-14 measurement terminal MT214 may be electrically connected to the sixth connection terminal T6.

Accordingly, as described with reference to FIG. 6, multiple connection resistances may be simultaneously measured through two contacts by using one current source voltmeter CSVM. However, in an embodiment PCB output pads of the 2-3-1 PCB output pad group POPGR31 electrically connected to IC output pads may not be electrically connected to measurement terminals. PCB output pads of the 1-3-2 PCB output pad group POPGL32 electrically connected to IC output pads may not be electrically connected to measurement terminals. Accordingly, connection resistance between IC input pads located at a central portion of the display panel 10 and corresponding IC output pads of the integrated circuit chip 30 is not measured.

In general, when the integrated circuit chip 30 is adhered to the display panel 10, the integrated circuit chip 30 adhered to a central portion of the display panel 10 is unlikely to have poor bonding quality, but the integrated circuit chip 30 adhered to an outer portion of the display panel 10 is likely to have poor bonding quality. In an embodiment in which connection resistance is measured by using one current source voltmeter CSVM connected to the connection jig JIG including 14 terminals as described with reference to FIG. 6, measurement of a connection resistance between IC output pads of some integrated circuit chips 30 and IC input pads of the display panel 10 may be omitted to simultaneously measure multiple connection resistances through two contacts. Accordingly, bonding quality between the integrated circuit chip 30 and the display panel 10 may be efficiently tested by testing bonding quality of the integrated circuit chip 30 adhered at a location where bonding quality is likely to be poor.

Figure 10:
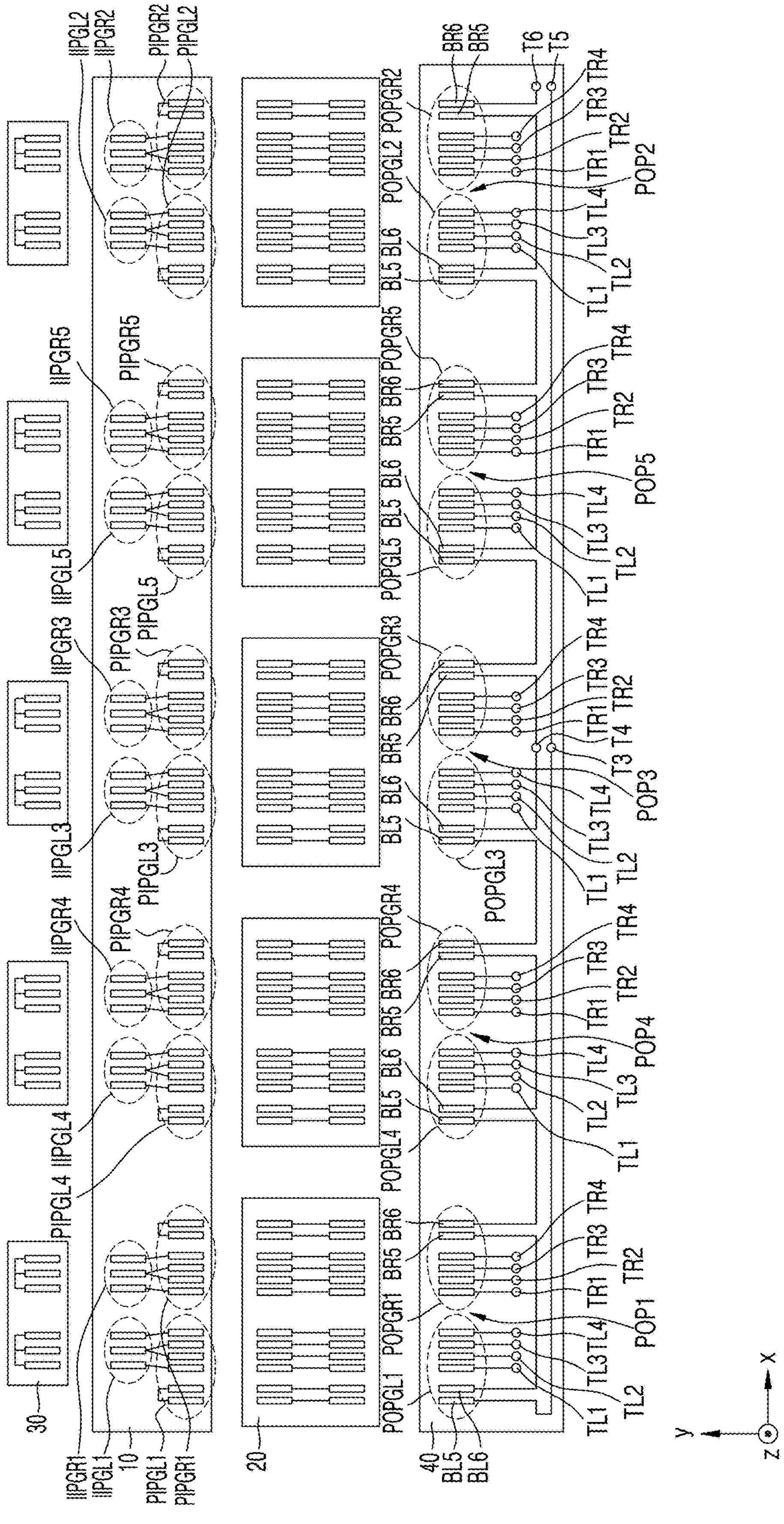
FIG. 10 is an exploded plan view schematically illustrating a portion of a display apparatus, according to an embodiment of the present disclosure.

FIG. 10 is an exploded plan view schematically illustrating a portion of a display apparatus, according to an embodiment. In FIG. 10, for convenience, a plurality of flexible printed circuit boards 20 are separated from the display panel 10 and the printed circuit board 40, and a plurality of integrated circuit chips 30 are separated from the display panel 10. In FIG. 10, only a portion (e.g., a portion in the −y direction) of the display panel 10 is illustrated, only a portion (e.g., a portion in the +y direction) of the printed circuit board 40 is illustrated, and the PCB signal input pad SA, the IC signal input pad SC, the PCB signal output pad SB, the IC signal output pad ISC, the lower signal transmission pad FSB, and the upper signal transmission pad FSA are not illustrated for convenience of explanation.

As shown in FIG. 10, in an embodiment a plurality of PCB output pad units POP may further include a fourth PCB output pad unit POP4 and a fifth PCB output pad unit POP5. The fourth PCB output pad unit POP4 may be disposed between the first PCB output pad unit POP1 and the third PCB output pad unit POP3 (e.g., in the x-axis direction), and the fifth PCB output pad unit POP5 may be located between the second PCB output pad unit POP2 and the third PCB output pad unit POP3 (e.g., in the x-axis direction). For example, in an embodiment the display apparatus of FIG. 10 may include five PCB output pad units POP, and thus, the display apparatus of FIG. 10 may include five integrated circuit chips 30.

Hereinafter, for convenience of explanation, the first PCB output pad group POPGL included in the fourth PCB output pad unit POP4 is referred to as a 1-4 PCB output pad group POPGL4, and the second PCB output pad group POPGR included in the fourth PCB output pad unit POP4 is referred to as a 2-4 PCB output pad group POPGR4. The first PCB output pad group POPGL included in the fifth PCB output pad unit POP5 is referred to as a 1-5 PCB output pad group POPGL5, and the second PCB output pad group POPGR included in the second PCB output pad unit POP2 is referred to as a 2-5 PCB output pad group POPGR5. In an embodiment, in a plan view, the 1-4 PCB output pad group POPGL4 may be located closer to the first side S1 of the display panel 10 (e.g., in the x-axis direction) than the 2-4 PCB output pad group POPGR4, and in a plan view, the 1-5 PCB output pad group POPGL5 may be located closer to the first side S1 of the display panel 10 than the 2-5 PCB output pad group POPGR5 (e.g., in the x-axis direction).

Also, the first PCB input pad group PIPGL electrically connected to the 1-4 PCB output pad group POPGL4 is referred to as a 1-4 PCB input pad group PIPGL4, and the first IC input pad group IIPGL electrically connected to the 1-4 PCB output pad group POPGL4 is referred to as a 1-4 IC input pad group IIPGL4. The second PCB input pad group PIPGR electrically connected to the 2-4 PCB output pad group POPGR4 is referred to as a 2-4 PCB input pad group PIPGR4, and the second IC input pad group IIPGR electrically connected to the 2-4 PCB output pad group POPGR4 is referred to as a 2-4 IC input pad group IIPGR4.

The first PCB input pad group PIPGL included in the 1-5 PCB output pad group POPGL5 is referred to as a 1-5 PCB input pad group PIPGL5, and the first IC input pad group IIPGL electrically connected to the 1-5 PCB output pad group POPGL5 is referred to as a 1-5 IC input pad group IIPGL5. The second PCB input pad group PIPGR electrically connected to the 2-5 PCB output pad group POPGR5 is referred to as a 2-5 PCB input pad group PIPGR5, and the second IC input pad group IIPGR electrically connected to the 2-5 PCB output pad group POPGR5 is referred to as a 2-5 IC input pad group IIPGR5.

Accordingly, in an embodiment a connection resistance between an IC input pad of the 1-4 IC input pad group IIPGL4 and an IC output pad of the integrated circuit chip 30 may be measured by using the 1-1 connection terminal TL1, the 1-2 connection terminal TL2, the 1-3 connection terminal TL3, and the 1-4 connection terminal TL4 electrically connected to PCB output pads of the 1-4 PCB output pad group POPGL4. A connection resistance between an IC input pad of the 2-4 IC input pad group IIPGR4 and an IC output pad of the integrated circuit chip 30 may be measured by using the 2-1 connection terminal TR1, the 2-2 connection terminal TR2, the 2-3 connection terminal TR3, and the 2-4 connection terminal TR4 electrically connected to PCB output pads of the 2-4 PCB output pad group POPGR4.

In an embodiment, a connection resistance between an IC input pad of the 1-5 IC input pad group IIPGL5 and an IC output pad of the integrated circuit chip 30 may be measured by using the 1-1 connection terminal TL1, the 1-2 connection terminal TL2, the 1-3 connection terminal TL3, and the 1-4 connection terminal TL4 electrically connected to PCB output pads of the 1-5 PCB output pad group POPGL5. A connection resistance between an IC input pad of the 2-3-2 IC input pad group IIPGR32 and an IC output pad of the integrated circuit chip 30 may be measured by using the 2-1 connection terminal TR1, the 2-2 connection terminal TR2, the 2-3 connection terminal TR3, and the 2-4 connection terminal TR4 electrically connected to PCB output pads of the 2-5 PCB output pad group POPGR5.

In an embodiment, the 1-5 PCB output pad BL5 of the 1-1 PCB output pad group POPGL1 may be connected to the third connection terminal T3, and the 1-6 PCB output pad BL6 of the 1-1 PCB output pad group POPGL1 may be connected to the 2-5 PCB output pad BR5 of the 2-1 PCB output pad group POPGR1. The 2-6 PCB output pad BR6 of the 2-1 PCB output pad group POPGR1 may be connected to the 1-5 PCB output pad BL5 of the 1-4 PCB output pad group POPGL4, and the 1-6 PCB output pad BL6 of the 1-4 PCB output pad group POPGL4 may be connected to the 2-5 PCB output pad BR5 of the 2-4 PCB output pad group POPGR4. The 2-6 PCB output pad BR6 of the 2-4 PCB output pad group POPGR4 may be connected to the 1-5 PCB output pad BL5 of the 1-3 PCB output pad group POPGL3, and the 1-6 PCB output pad BL6 of the 1-3 PCB output pad group POPGL3 may be connected to the fourth connection terminal T4. The third connection terminal T3 may also be connected to the fifth connection terminal T5.

In an embodiment, the 2-5 PCB output pad BR5 of the 2-3 PCB output pad group POPGR3 may be connected to the fourth connection terminal T4. The 2-6 PCB output pad BR6 of the 2-3 PCB output pad group POPGR3 may be connected to the 1-5 PCB output pad BL5 of the 1-5 PCB output pad group POPGL5, and the 1-6 PCB output pad BL6 of the 1-5 PCB output pad group POPGL5 may be connected to the 2-5 PCB output pad BR5 of the 2-5 PCB output pad group POPGR5. The 2-6 PCB output pad BR6 of the 2-5 PCB output pad group POPGR5 may be connected to the 1-5 PCB output pad BL5 of the 1-2 PCB output pad group POPGL2. The 1-6 PCB output pad BL6 of the 1-2 PCB output pad group POPGL2 may be connected to the 2-5 PCB output pad BR5 of the 2-2 PCB output pad group POPGR2, and the 2-6 PCB output pad BR6 of the 2-2 PCB output pad group POPGR2 may be connected to the sixth connection terminal T6.

In this embodiment, current I may be applied by electrically connecting a current source to the third connection terminal T3 and the fourth connection terminal T4, and a voltage V may be measured by electrically connecting a voltmeter to the third connection terminal T3 and the fourth connection terminal T4. Accordingly, a connection resistance between a PCB input pad of the 1-1 PCB input pad group PIPGL1 and an upper transmission pad of the flexible printed circuit board 20 and a connection resistance between a PCB input pad of the 2-1 PCB input pad group PIPGR1 and an upper transmission pad of the flexible printed circuit board 20 may be measured. In an embodiment, a connection resistance between a PCB input pad of the 1-4 PCB input pad group PIPGL4 and an upper transmission pad of the flexible printed circuit board 20, a connection resistance between a PCB input pad of the 2-4 PCB input pad group PIPGR4 and an upper transmission pad of the flexible printed circuit board 20, and a connection resistance between a PCB input pad of the 1-3 PCB input pad group PIPGL3 and an upper transmission pad of the flexible printed circuit board 20 may be measured.

Alternatively, in an embodiment current I may be applied by electrically connecting a current source to the fifth connection terminal T5 and the sixth connection terminal T6, and a voltage V may be measured by electrically connecting a voltmeter to the fifth connection terminal T5 and the sixth connection terminal T6. Accordingly, a connection resistance between a PCB input pad of the 2-3 PCB input pad group PIPGR3 and an upper transmission pad of the flexible printed circuit board 20, a connection resistance between a PCB input pad of the 1-5 PCB input pad group PIPGL5 and an upper transmission pad of the flexible printed circuit board 20, and a connection resistance between a PCB input pad of the 2-5 PCB input pad group PIPGR5 and an upper transmission pad of the flexible printed circuit board 20 may be measured. A connection resistance between a PCB input pad of the 1-2 PCB input pad group PIPGL2 and an upper transmission pad of the flexible printed circuit board 20 and a connection resistance between a PCB input pad of the 2-2 PCB input pad group PIPGR2 and an upper transmission pad of the flexible printed circuit board 20 may be measured.

Such connection terminals and measurement terminals located on the printed circuit board 740 may be electrically connected to each other. The display apparatus according to the present embodiment includes more integrated circuit chips 30 than an embodiment of the display apparatus described with reference to FIG. 8. Accordingly, the display apparatus according to the present embodiment may have electrical connection between connection terminals and measurement terminals of the printed circuit board 40, which is different from that of the display apparatus described with reference to FIG. 8. For example, in an embodiment some of measurement terminals of the printed circuit board 40 may not be electrically connected to connection terminals.

Like in an embodiment of FIG. 8, even in an embodiment of FIG. 10, the 1-1 measurement terminal MT11 may be electrically connected to the 1-1 connection terminal TL1 connected to the 1-1 PCB output pad BL1 of the 1-1 PCB output pad group POPGL1, and the 1-2 measurement terminal MT12 may be electrically connected to the 1-2 connection terminal TL2 connected to the 1-2 PCB output pad BL2 of the 1-1 PCB output pad group POPGL1. The 1-3 measurement terminal MT13 may be electrically connected to the 1-3 connection terminal TL3 connected to the 1-3 PCB output pad BL3 of the 1-1 PCB output pad group POPGL1, and the 1-4 measurement terminal MT14 may be electrically connected to the 1-4 connection terminal TL4 connected to the 1-4 PCB output pad BL4 of the 1-1 PCB output pad group POPGL1. For example, even in the present embodiment, PCB output pads of the 1-1 PCB output pad group POPGL1 electrically connected to IC output pads may be electrically connected to some of measurement terminals of the first measurement terminal group MTG1.

In an embodiment, the 2-9 measurement terminal MT29 may be electrically connected to the 2-1 connection terminal TR1 connected to the 2-1 PCB output pad BR1 of the 2-2 PCB output pad group POPGR2, and the 2-10 measurement terminal MT210 may be electrically connected to the 2-2 connection terminal TR2 connected to the 2-2 PCB output pad BR2 of the 2-2 PCB output pad group POPGR2. The 2-11 measurement terminal MT211 may be electrically connected to the 2-3 connection terminal TR3 connected to the 2-3 PCB output pad BR3 of the 2-2 PCB output pad group POPGR2, and the 2-12 measurement terminal MT212 may be electrically connected to the 2-4 connection terminal TR4 connected to the 2-4 PCB output pad BR4 of the 2-2 PCB output pad group POPGR2. For example, even in the present embodiment, PCB output pads of the 2-2 PCB output pad group POPGR2 electrically connected to IC output pads may be electrically connected to some of measurement terminals of the second measurement terminal group MTG2.

However, in an embodiment of FIG. 10, the 1-5 measurement terminal MT15 may be electrically connected to the 2-1 connection terminal TR1 connected to the 2-1 PCB output pad BR1 of the 2-4 PCB output pad group POPGR4, and the 1-6 measurement terminal MT16 may be electrically connected to the 2-2 connection terminal TR2 connected to the 2-2 PCB output pad BR2 of the 2-4 PCB output pad group POPGR4. The 1-7 measurement terminal MT17 may be electrically connected to the 2-3 connection terminal TR3 connected to the 2-3 PCB output pad BR3 of the 2-4 PCB output pad group POPGR4, and the 1-8 measurement terminal MT18 may be electrically connected to the 2-4 connection terminal TR4 connected to the 2-4 PCB output pad BR4 of the 2-4 PCB output pad group POPGR4. For example, in the present embodiment, PCB output pads of the 2-4 PCB output pad group POPGR4 electrically connected to IC output pads may be electrically connected to some of measurement terminals of the first measurement terminal group MTG1.

In an embodiment, the 1-9 measurement terminal MT19 may be electrically connected to the 1-1 connection terminal TL1 connected to the 1-1 PCB output pad BL1 of the 1-3 PCB output pad group POPGL3, and the 1-10 measurement terminal MT110 may be electrically connected to the 1-2 connection terminal TL2 connected to the 1-2 PCB output pad BL2 of the 1-3 PCB output pad group POPGL3. The 1-11 measurement terminal MT111 may be electrically connected to the 1-3 connection terminal TL3 connected to the 1-3 PCB output pad BL3 of the 1-3 PCB output pad group POPGL3, and the 1-12 measurement terminal MT112 may be electrically connected to the 1-4 connection terminal TL4 connected to the 1-4 PCB output pad BL4 of the 1-3 PCB output pad group POPGL3. For example, even in the present embodiment, PCB output pads of the 1-3 PCB output pad group POPGL3 electrically connected to IC output pads may be electrically connected to some of measurement terminals of the first measurement terminal group MTG1.

In an embodiment, the 2-1 measurement terminal MT21 may be electrically connected to the 2-1 connection terminal TR1 connected to the 2-1 PCB output pad BR1 of the 2-3 PCB output pad group POPGR3, and the 2-2 measurement terminal MT22 may be electrically connected to the 2-2 connection terminal TR2 connected to the 2-2 PCB output pad BR2 of the 2-3 PCB output pad group POPGR3. The 2-3 measurement terminal MT23 may be electrically connected to the 2-3 connection terminal TR3 connected to the 2-3 PCB output pad BR3 of the 2-3 PCB output pad group POPGR3, and the 2-4 measurement terminal MT24 may be electrically connected to the 2-4 connection terminal TR4 connected to the 2-4 PCB output pad BR4 of the 2-3 PCB output pad group POPGR3. For example, even in the present embodiment, PCB output pads of the 2-3 PCB output pad group POPGR3 electrically connected to IC output pads may be electrically connected to some of measurement terminals of the second measurement terminal group MTG2.

In an embodiment, the 2-5 measurement terminal MT25 may be electrically connected to the 1-1 connection terminal TL1 connected to the 1-1 PCB output pad BL1 of the 1-5 PCB output pad group POPGL5, and the 2-6 measurement terminal MT26 may be electrically connected to the 1-2 connection terminal TL2 connected to the 1-2 PCB output pad BL2 of the 1-5 PCB output pad group POPGL5. The 2-7 measurement terminal MT27 may be electrically connected to the 1-3 connection terminal TL3 connected to the 1-3 PCB output pad BL3 of the 1-5 PCB output pad group POPGL5, and the 2-8 measurement terminal MT28 may be electrically connected to the 1-4 connection terminal TL4 connected to the 1-4 PCB output pad BL4 of the 1-5 PCB output pad group POPGL5. For example, in the present embodiment, PCB output pads of the 1-5 PCB output pad group POPGL5 electrically connected to IC output pads may be electrically connected to some of measurement terminals of the second measurement terminal group MTG2.

Like in an embodiment of FIG. 8, even in an embodiment of FIG. 10, the 1-13 measurement terminal MT113 may be electrically connected to the third connection terminal T3, and the 1-14 measurement terminal MT114 may be electrically connected to the fourth connection terminal T4. The 2-13 measurement terminal MT213 may be electrically connected to the fifth connection terminal T5, and the 2-14 measurement terminal MT214 may be electrically connected to the sixth connection terminal T6.

Accordingly, as described with reference to FIG. 6, multiple resistances may be simultaneously measured through two contacts by using one current source voltmeter CSVM. However, in an embodiment PCB output pads of the 2-1 PCB output pad group POPGR1 electrically connected to IC output pads may not be electrically connected to measurement terminals. PCB output pads of the 1-4 PCB output pad group POPGL4 electrically connected to IC output pads may not be electrically connected to measurement terminals. PCB output pads of the 2-5 PCB output pad group POPGR5 electrically connected to IC output pads may not be electrically connected to measurement terminals. PCB output pads of the 1-2 PCB output pad group POPGL2 electrically connected to IC output pads may not be electrically connected to measurement terminals.

In an embodiment, connection resistances of a left side of the integrated circuit chip 30 electrically connected to PCB output pads of the first PCB output pad unit POP1, a right side of the integrated circuit chip 30 electrically connected to PCB output pads of the fourth PCB output pad unit POP4, a left side and a right side of the integrated circuit chip 30 electrically connected to PCB output pads of the third PCB output pad unit POP3, a left side of the integrated circuit chip 30 electrically connected to PCB output pads of the fifth PCB output pad unit POP5, and a right side of the integrated circuit chip 30 electrically connected to PCB output pads of the second PCB output pad unit POP2 may be measured. Accordingly, in an embodiment at least one connection resistance may be measured for one integrated circuit chip 30, and connection resistances of left sides of the integrated circuit chips 30 and connection resistances of right sides of the integrated circuit chips 30 may be equally measured. Accordingly, bonding quality between the integrated circuit chip 30 and the display panel 10 may be efficiently tested.

Figure 11:
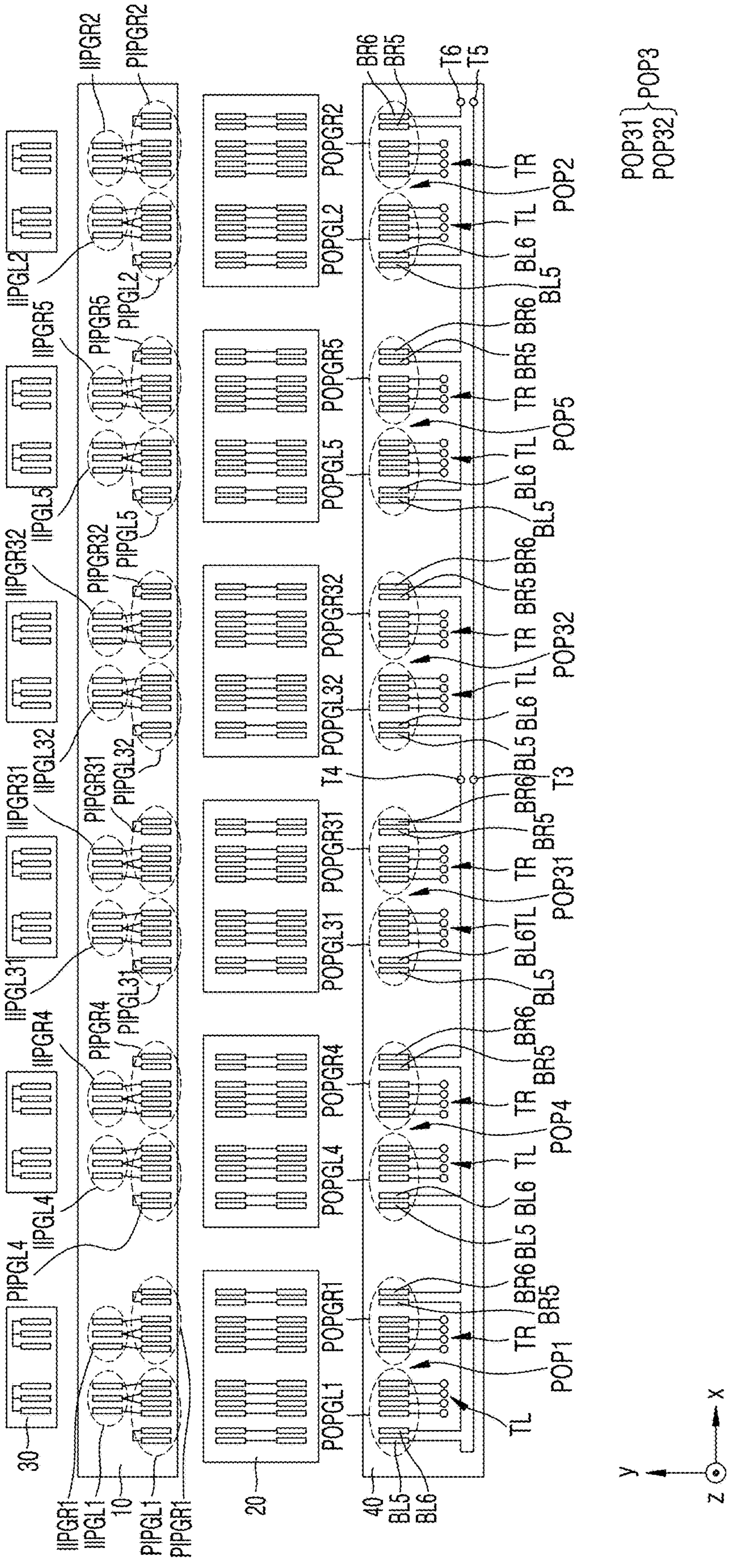
FIG. 11 is an exploded plan view schematically illustrating a portion of a display apparatus, according to an embodiment of the present disclosure.

FIG. 11 is an exploded plan view schematically illustrating a portion of a display apparatus, according to an embodiment. In FIG. 11, for convenience, a plurality of flexible printed circuit boards 20 are separated from the display panel 10 and the printed circuit board 40, and a plurality of integrated circuit chips 30 are separated from the display panel 10. In FIG. 11, only a portion (e.g., a portion in the −y direction) of the display panel 10 is illustrated, only a portion (e.g., a portion in the +y direction) of the printed circuit board 40 is illustrated, and the PCB signal input pad SA, the IC signal input pad SC, the PCB signal output pad SB, the IC signal output pad ISC, the lower signal transmission pad FSB, and the upper signal transmission pad FSA are not illustrated for economy of explanation. The display apparatus of an embodiment of FIG. 11 includes six PCB output pad units POP, and thus, the display apparatus of FIG. 11 may include six integrated circuit chips 30.

In FIG. 11, a plurality of first connection terminals TL and a plurality of second connection terminals TR are illustrated. A connection terminal disposed first from the left among the first connection terminals LT is a 1-1 connection terminal, and a connection terminal disposed second from the left among the first connection terminals TL is a 1-2 connection terminal. A connection terminal disposed third from the left among the first connection terminals TL is a 1-3 connection terminal, and a connection terminal disposed fourth from the left among the first connection terminals TL is a 1-4 connection terminal. A connection terminal connected first from the left among the second connection terminals TR is a 2-1 connection terminal, and a connection terminal located second from the left among the second connection terminals TR is a 2-2 connection terminal. A connection terminal located third from the left among the second connection terminals TR is a 2-3 connection terminal, and a connection terminal located fourth from the left among the second connection terminals TR is a 2-4 connection terminal.

Like in the display apparatus described with reference to FIG. 10, even in the display apparatus of an embodiment of FIG. 11, a connection resistance between an IC input pad of the 1-4 IC input pad group IIPGL4 and an IC output pad of the integrated circuit chip 30 may be measured by using the 1-1 connection terminal, the 1-2 connection terminal, the 1-3 connection terminal, and the 1-4 connection terminal electrically connected to PCB output pads of the 1-4 PCB output pad group POPGL4. A connection resistance between an IC input pad of the 2-4 IC input pad group IIPGR4 and an IC output pad of the integrated circuit chip 30 may be measured by using the 2-1 connection terminal, the 2-2 connection terminal, the 2-3 connection terminal, and the 2-4 connection terminal electrically connected to PCB output pads of the 2-4 PCB output pad group POPGR4.

In an embodiment, a connection resistance between an IC input pad of the 1-5 IC input pad group IIPGL5 and an IC output pad of the integrated circuit chip 30 may be measured by using the 1-1 connection terminal, the 1-2 connection terminal, the 1-3 connection terminal, and the 1-4 connection terminal electrically connected to PCB output pads of the 1-5 PCB output pad group POPGL5. A connection resistance between an IC input pad of the 2-3-2 IC input pad group IIPGR32 and an IC output pad of the integrated circuit chip 30 may be measured by using the 2-1 connection terminal, the 2-2 connection terminal, the 2-3 connection terminal, and the 2-4 connection terminal electrically connected to PCB output pads of the 2-5 PCB output pad group POPGR5.

In an embodiment, the 1-5 PCB output pad BL5 of the 1-1 PCB output pad group POPGL1 may be connected to the third connection terminal T3, and the 1-6 PCB output pad BL6 of the 1-1 PCB output pad group POPGL1 may be connected to the 2-5 PCB output pad BR5 of the 2-1 PCB output pad group POPGR1. In an embodiment, the 2-6 PCB output pad BR6 of the 2-1 PCB output pad group POPGR1 may be connected to the 1-5 PCB output pad BL5 of the 1-4 PCB output pad group POPGL4, and the 1-6 PCB output pad BL6 of the 1-4 PCB output pad group POPGL4 may be connected to the 2-5 PCB output pad BR5 of the 2-4 PCB output pad group POPGR4. The 2-6 PCB output pad BR6 of the 2-4 PCB output pad group POPGR4 may be connected to the 1-5 PCB output pad BL5 of the 1-3-1 PCB output pad group POPGL31, and the 1-6 PCB output pad BL6 of the 1-3-1 PCB output pad group POPGL31 may be connected to the fourth connection terminal T4. The third connection terminal T3 may also be connected to the fifth connection terminal T5.

In an embodiment, the 1-5 PCB output pad BL5 of the 1-3-2 PCB output pad group POPGL32 may be connected to the fourth connection terminal T4. The 1-6 PCB output pad BL6 of the 1-3-2 PCB output pad group POPGL32 may be connected to the 2-5 PCB output pad BR5 of the 2-3-2 PCB output pad group POPGR32, and the 2-6 PCB output pad BR6 of the 2-3-2 PCB output pad group POPGR32 may be connected to the 1-5 PCB output pad BL5 of the 1-5 PCB output pad group POPGL5. The 1-6 PCB output pad BL6 of the 1-5 PCB output pad group POPGL5 may be connected to the 2-5 PCB output pad BR5 of the 2-5 PCB output pad group POPGR5, and the 2-6 PCB output pad BR6 of the 2-5 PCB output pad group POPGR5 may be connected to the 1-5 PCB output pad BL5 of the 1-2 PCB output pad group POPGL2. The 1-6 PCB output pad BL6 of the 1-2 PCB output pad group POPGL2 may be connected to the 2-5 PCB output pad BR5 of the 2-2 PCB output pad group POPGR2, and the 2-6 PCB output pad BR6 of the 2-2 PCB output pad group POPGR2 may be connected to the sixth connection terminal T6.

In this embodiment, current I may be applied by electrically connecting a current source to the third connection terminal T3 and the fourth connection terminal T4, and a voltage V may be measured by electrically connecting a voltmeter to the third connection terminal T3 and the fourth connection terminal T4. Accordingly, a connection resistance between a PCB input pad of the 1-1 PCB input pad group PIPGL1 and an upper transmission pad of the flexible printed circuit board 20 and a connection resistance between a PCB input pad of the 2-1 PCB input pad group PIPGR1 and an upper transmission pad of the flexible printed circuit board 20 may be measured. A connection resistance between a PCB input pad of the 1-4 PCB input pad group PIPGL4 and an upper transmission pad of the flexible printed circuit board 20 and a connection resistance between a PCB input pad of the 2-4 PCB input pad group PIPGR4 and an upper transmission pad of the flexible printed circuit board 20 may be measured. A connection resistance between a PCB input pad of the 1-3-1 PCB input pad group PIPGL31 and an upper transmission pad of the flexible printed circuit board 20 and a connection resistance between a PCB input pad of the 2-3-1 PCB input pad group PIPGR31 and an upper transmission pad of the flexible printed circuit board 20 may be measured.

Alternatively, in an embodiment current I may be applied by electrically connecting a current source to the fifth connection terminal T5 and the sixth connection terminal T6, and a voltage V may be measured by electrically connecting a voltmeter to the fifth connection terminal T5 and the sixth connection terminal T6. Accordingly, a connection resistance between a PCB input pad of the 1-3-2 PCB input pad group PIPGL32 and an upper transmission pad of the flexible printed circuit board 20 and a connection resistance between a PCB input pad of the 2-3-2 PCB input pad group PIPGR32 and an upper transmission pad of the flexible printed circuit board 20 may be measured. A connection resistance between a PCB input pad of the 1-5 PCB input pad group PIPGL5 and an upper transmission pad of the flexible printed circuit board 20 and connection resistance between a PCB input pad of the 2-5 PCB input pad group PIPGR5 and an upper transmission pad of the flexible printed circuit board 20 may be measured. A connection resistance between a PCB input pad of the 1-2 PCB input pad group PIPGL2 and an upper transmission pad of the flexible printed circuit board 20 and connection resistance between a PCB input pad of the 2-2 PCB input pad group PIPGR2 and an upper transmission pad of the flexible printed circuit board 20 may be measured.

Such connection terminals and measurement terminals located on the printed circuit board 40 may be electrically connected to each other. The display apparatus according to the present embodiment includes more integrated circuit chips 30 than the display apparatus of an embodiment described with reference to FIG. 8. Accordingly, the display apparatus according to the present embodiment may have electrical connection between connection terminals and measurement terminals of the printed circuit board 470, which is different from that of the display apparatus described with reference to FIG. 8. For example, some of measurement terminals of the printed circuit board 40 may not be electrically connected to connection terminals.

Like in an embodiment of FIG. 8, even in an embodiment of FIG. 11, the 1-1 measurement terminal MT11 may be electrically connected to the 1-1 connection terminal connected to the 1-1 PCB output pad BL1 of the 1-1 PCB output pad group POPGL1, and the 1-2 measurement terminal MT12 may be electrically connected to the 1-2 connection terminal connected to the 1-2 PCB output pad BL2 of the 1-1 PCB output pad group POPGL1. The 1-3 measurement terminal MT13 may be electrically connected to the 1-3 connection terminal connected to the 1-3 PCB output pad BL3 of the 1-1 PCB output pad group POPGL1, and the 1-4 measurement terminal MT14 may be electrically connected to the 1-4 connection terminal connected to the 1-4 PCB output pad BL4 of the 1-1 PCB output pad group POPGL1. For example, even in the present embodiment, PCB output pads of the 1-1 PCB output pad group POPGL1 electrically connected to IC output pads may be electrically connected to some of measurement terminals of the first measurement terminal group MTG1.

In an embodiment, the 2-9 measurement terminal MT29 may be electrically connected to the 2-1 connection terminal connected to the 2-1 PCB output pad BR1 of the 2-2 PCB output pad group POPGR2, and the 2-10 measurement terminal MT210 may be electrically connected to the 2-2 connection terminal connected to the 2-2 PCB output pad BR2 of the 2-2 PCB output pad group POPGR2. The 2-11 measurement terminal MT211 may be electrically connected to the 2-3 connection terminal connected to the 2-3 PCB output pad BR3 of the 2-2 PCB output pad group POPGR2, and the 2-12 measurement terminal MT212 may be electrically connected to the 2-4 connection terminal connected to the 2-4 PCB output pad BR4 of the 2-2 PCB output pad group POPGR2. For example, even in the present embodiment, PCB output pads of the 2-2 PCB output pad group POPGR2 electrically connected to IC output pads may be electrically connected to some of measurement terminals of the second measurement terminal group MTG2.

However, in an embodiment of FIG. 11, the 1-5 measurement terminal MT15 may be electrically connected to the 2-1 connection terminal connected to the 2-1 PCB output pad BR1 of the 2-4 PCB output pad group POPGR4, and the 1-6 measurement terminal MT16 may be electrically connected to the 2-2 connection terminal connected to the 2-2 PCB output pad BR2 of the 2-4 PCB output pad group POPGR4. The 1-7 measurement terminal MT17 may be electrically connected to the 2-3 connection terminal connected to the 2-3 PCB output pad BR3 of the 2-4 PCB output pad group POPGR4, and the 1-8 measurement terminal MT18 may be electrically connected to the 2-4 connection terminal connected to the 2-4 PCB output pad BR4 of the 2-4 PCB output pad group POPGR4. For example, even in the present embodiment, PCB output pads of the 2-4 PCB output pad group POPGR4 electrically connected to IC output pads may be electrically connected to some of measurement terminals of the first measurement terminal group MTG1.

In an embodiment, the 1-9 measurement terminal MT19 may be electrically connected to the 1-1 connection terminal connected to the 1-1 PCB output pad BL1 of the 1-3-1 PCB output pad group POPGL31, and the 1-10 measurement terminal MT110 may be electrically connected to the 1-2 connection terminal connected to the 1-2 PCB output pad BL2 of the 1-3-1 PCB output pad group POPGL31. The 1-11 measurement terminal MT111 may be electrically connected to the 1-3 connection terminal connected to the 1-3 PCB output pad BL3 of the 1-3-1 PCB output pad group POPGL31, and the 1-12 measurement terminal MT112 may be electrically connected to the 1-4 connection terminal connected to the 1-4 PCB output pad BL4 of the 1-3-1 PCB output pad group POPGL31. For example, even in the present embodiment, PCB output pads of the 1-3-1 PCB output pad group POPGL31 electrically connected to IC output pads may be electrically connected to some of measurement terminals of the first measurement terminal group MTG1.

In an embodiment, the 2-1 measurement terminal MT21 may be electrically connected to the 2-1 connection terminal connected to the 2-1 PCB output pad BR1 of the 2-3-2 PCB output pad group POPGR32, and the 2-2 measurement terminal MT22 may be electrically connected to the 2-2 connection terminal connected to the 2-2 PCB output pad BR2 of the 2-3-2 PCB output pad group POPGR32. The 2-3 measurement terminal MT23 may be electrically connected to the 2-3 connection terminal connected to the 2-3 PCB output pad BR3 of the 2-3-2 PCB output pad group POPGR32, and the 2-4 measurement terminal MT24 may be electrically connected to the 2-4 connection terminal connected to the 2-4 PCB output pad BR4 of the 2-3-2 PCB output pad group POPGR32. For example, in the present embodiment, PCB output pads of the 2-3-2 PCB output pad group POPGR32 electrically connected to IC output pads may be electrically connected to some of measurement terminals of the second measurement terminal group MTG2.

In an embodiment, the 2-5 measurement terminal MT25 may be electrically connected to the 1-1 connection terminal connected to the 1-1 PCB output pad BL1 of the 1-5 PCB output pad group POPGL5, and the 2-6 measurement terminal MT26 may be electrically connected to the 1-2 connection terminal connected to the 1-2 PCB output pad BL2 of the 1-5 PCB output pad group POPGL5. The 2-7 measurement terminal MT27 may be electrically connected to the 1-3 connection terminal connected to the 1-3 PCB output pad BL3 of the 1-5 PCB output pad group POPGL5, and the 2-8 measurement terminal MT28 may be electrically connected to the 1-4 connection terminal connected to the 1-4 PCB output pad BL4 of the 1-5 PCB output pad group POPGL5. For example, in the present embodiment, PCB output pads of the 1-5 PCB output pad group POPGL5 electrically connected to IC output pads may be electrically connected to some of measurement terminals of the second measurement terminal group MTG2.

Like in an embodiment of FIG. 8, even in an embodiment of FIG. 11, the 1-13 measurement terminal MT113 may be electrically connected to the third connection terminal T3, and the 1-14 measurement terminal MT114 may be electrically connected to the fourth connection terminal T4. The 2-13 measurement terminal MT213 may be electrically connected to the fifth connection terminal T5, and the 2-14 measurement terminal MT214 may be electrically connected to the sixth connection terminal T6.

Accordingly, as described with reference to FIG. 6, multiple connection resistances may be simultaneously measured through two contacts by using one current source voltmeter CSVM. However, in an embodiment the PCB output pads of the 2-1 PCB output pad group POPGR1 electrically connected to IC output pads may not be electrically connected to measurement terminals. PCB output pads of the 1-4 PCB output pad group POPGL4 electrically connected to IC output pads may not be electrically connected to measurement terminals. PCB output pads of the 2-3-1 PCB output pad group POPGR31 electrically connected to IC output pads may not be electrically connected to measurement terminals. PCB output pads of the 1-3-2 PCB output pad group POPGL32 electrically connected to IC output pads may not be electrically connected to measurement terminals. PCB output pads of the 2-5 PCB output pad group POPGR5 electrically connected to IC output pads may not be electrically connected to measurement terminals. PCB output pads of the 1-2 PCB output pad group POPGL2 electrically connected to IC output pads may not be electrically connected to measurement terminals.

In an embodiment, connection resistances of a left side of the integrated circuit chip 30 electrically connected to PCB output pads of the first PCB output pad unit POP1, a right side of the integrated circuit chip 30 electrically connected to PCB output pads of the fourth PCB output pad unit POP4, a left side of the integrated circuit chip 30 electrically connected to PCB output pads of the 3-1 PCB output pad unit POP31, a right side of the integrated circuit chip 30 electrically connected to PCB output pads of the 3-2 PCB output pad unit POP32, a left side of the integrated circuit chip 30 electrically connected to PXCB output pads of the fifth PCB output pad unit POP5, and a right side of the integrated circuit chip 30 electrically connected to PCB output pads of the second PCB output pad unit POP2 may be measured. Accordingly, at least one connection resistance may be measured for one integrated circuit chip 30, and connection resistances of left sides of the integrated circuit chips 30 and connection resistances of right sides of the integrated circuit chips 30 may be equally measured. Accordingly, bonding quality between the integrated circuit chip 30 and the display panel 10 may be efficiently tested.

Figure 12:
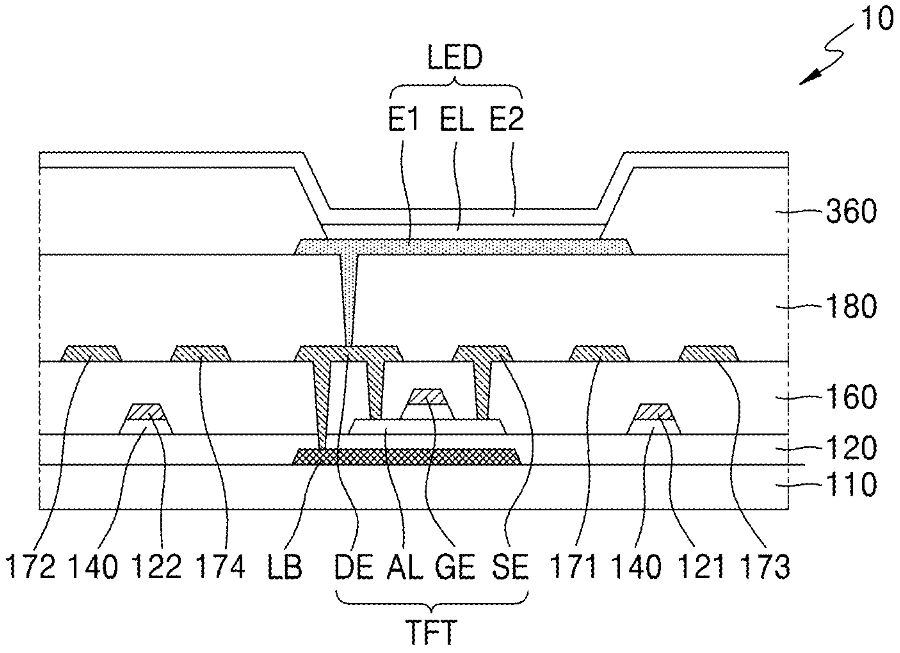
FIG. 12 is a cross-sectional view schematically illustrating a display area of a display apparatus, according to an embodiment of the present disclosure.

FIG. 12 is a cross-sectional view schematically illustrating the display area DA of the display panel 10 provided in a display apparatus, according to an embodiment. As shown in FIG. 12, the display panel 10 of the display apparatus includes a substrate 110 and various layers and wirings located on (e.g., disposed thereon) the substrate 110. The substrate 110 may include an insulating material such as glass or plastic. For example, in an embodiment the substrate 110 may have a multi-layer structure including two resin layers and an inorganic layer located between the two resin layers.

A light-blocking layer LB may be located on the substrate 110 (e.g., disposed directly thereon). The light-blocking layer LB may block external light from reaching a semiconductor layer AL of a transistor TFT to prevent or minimize deterioration of characteristics of the semiconductor layer AL. In the display panel 10, the light-blocking layer LB may be an electrode receiving a specific voltage or a wiring transmitting a specific voltage. In an embodiment, the light-blocking layer LB may include copper (Cu), aluminum (Al), silver (Ag), chromium (Cr), titanium (Ti), or tantalum (Ta) and may have a single or multi-layer structure.

In an embodiment, a barrier layer that may include an inorganic insulating material such as silicon nitride ($SiN_X$), silicon oxide ($SiO_X$), or silicon oxynitride ($SiO_XN_Y$) may be located between (e.g., disposed therebetween in a thickness direction of the substrate 110) the substrate 110 and the light-blocking layer LB. The barrier layer may have a single or multi-layer structure.

A buffer layer 120 may be located on (e.g., disposed directly thereon) the light-blocking layer LB. The buffer layer 120 may prevent diffusion of impurities from the substrate 110 to the semiconductor layer AL and may planarize a top surface of the substrate 110. In an embodiment, the buffer layer 120 may include an inorganic insulating material such as silicon nitride ($SiN_X$), silicon oxide ($SiO_X$), or silicon oxynitride ($SiO_XN_Y$) and may have a single or multi-layer structure.

The semiconductor layer AL may be located on (e.g., disposed directly thereon) the buffer layer 120. The semiconductor layer AL may include a channel region of the transistor TFT and a source region and a drain region on both sides of the channel region. In an embodiment, the semiconductor layer AL may include any one of amorphous silicon, polycrystalline silicon, and an oxide semiconductor. In an embodiment in which the semiconductor layer AL includes an oxide semiconductor, the semiconductor layer AL may include at least one of zinc (Zn), indium (In), gallium (Ga), and tin (Sn). For example, in an embodiment the semiconductor layer AL may include indium-gallium-zinc oxide (IGZO).

A gate insulating layer 140 may be located on the semiconductor layer AL (e.g., disposed directly thereon). In an embodiment, the gate insulating layer 140 may include an inorganic insulating material such as silicon nitride ($SiN_X$), silicon oxide ($SiO_X$), or silicon oxynitride ($SiO_XN_Y$) and may have a single or multi-layer structure.

In an embodiment, a gate conductive layer that may include a gate electrode GE of the transistor TFT, a first scan line 121, or a second scan line 122 may be located on (e.g., disposed directly thereon) the gate insulating layer 140. In an embodiment, the gate conductive layer may include molybdenum (Mo), aluminum (Al), copper (Cu), or titanium (Ti) and may have a single or multi-layer structure.

In an embodiment, an interlayer insulating layer 160 may be located on (e.g., disposed directly thereon) the gate conductive layer. In an embodiment, the interlayer insulating layer 160 may include an inorganic insulating material such as silicon nitride ($SiN_X$), silicon oxide ($SiO_X$), or silicon oxynitride ($SiO_XN_Y$) and may have a single or multi-layer structure.

In an embodiment, a data conductive layer that may include a source electrode SE and a drain electrode DE of the transistor TFT, a data line 171, a driving voltage line 172, a common voltage line 173, or an initialization voltage line 174 may be located on (e.g., disposed directly thereon) the interlayer insulating layer 160. In some embodiments, the drain electrode DE may be connected to the light-blocking layer LB through a contact hole formed in the interlayer insulating layer 160 and the buffer layer 120. In an embodiment, the data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), or copper (Cu) and may have a single or multi-layer structure.

In an embodiment, a planarization layer 180 may be located on (e.g., disposed directly thereon) the data conductive layer. The planarization layer 180 may be an organic layer. For example, in an embodiment the planarization layer 180 may include an organic insulating material such as a general-purpose polymer such as poly(methyl methacrylate) or polystyrene, a polymer derivative having a phenolic group, an acrylic polymer, an imide-based polymer, polyimide, or a siloxane-based polymer.

In an embodiment, a passivation layer that may include an inorganic insulating material such as silicon nitride ($SiN_X$), silicon oxide ($SiO_X$), or silicon oxynitride ($SiO_XN_Y$) may be located between the data conductive layer and the planarization layer 180.

A pixel electrode E1 of a light-emitting diode LED may be located on (e.g., disposed directly thereon) the planarization layer 180. In an embodiment, the pixel electrode E1 may be connected to the drain electrode DE through a contact hole formed in the planarization layer 180. The pixel electrode E1 may include a reflective conductive material, a semi-transmissive conductive material, or a transparent conductive material. For example, in an embodiment the pixel electrode E1 may include a transparent conductive material such as indium tin oxide (ITO) or indium zinc oxide (IZO), and may include a metal or a metal alloy such as lithium (Li), calcium (Ca), aluminum (Al), silver (Ag), magnesium (Mg), or gold (Au).

A pixel-defining film 360 having an opening overlapping the pixel electrode E1 may be located on (e.g., disposed directly thereon) the planarization layer 180. The pixel-defining film 360 may include an organic insulating material such as an acrylic polymer or an imide-based polymer.

An emission layer EL may be located on (e.g., disposed thereon) the pixel electrode E1. At least one of a hole injection layer, a hole transport layer, an electron transport layer, and an electron injection layer, in addition to the emission layer EL, may be located on (e.g., disposed thereon) the pixel electrode E1.

A common electrode E2 may be located on (e.g., disposed thereon) the emission layer EL. The common electrode E2 may be integrally formed over multiple pixels. In an embodiment, the common electrode E2 may include a metal or a metal alloy having a low work function such as calcium (Ca), barium (Ba), magnesium (Mg), aluminum (Al), or silver (Ag) and may be formed as a thin layer to have light transmittance. In some embodiments, the common layer E2 may include a transparent conductive oxide such as indium tin oxide (ITO) or indium zinc oxide (IZO).

The light-emitting diode LED such as an organic light-emitting diode is located in each pixel PX, and each pixel PX includes the pixel electrode E1, the emission layer EL, and the common electrode E2 as described above. In an embodiment, the pixel electrode E1 may be an anode of the light-emitting diode LED, and the common electrode E2 may be a cathode of the light-emitting diode LED.

An encapsulation layer may be located on (e.g., disposed directly thereon) the common electrode E2. In an embodiment, the encapsulation layer may be a thin film encapsulation layer in which at least one inorganic layer and at least one organic layer are stacked (e.g. in a thickness direction of the substrate 110).

According to an embodiment as described above, a display apparatus that may easily check a bonding state between a flexible printed circuit board and a display panel and a bonding state between an integrated circuit chip and the display panel may be implemented. However, the scope of embodiments of the present disclosure are not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments of the present disclosure have been described with reference to the figures, it will be understood by one of ordinary skill in the art that various changes in form and details may be made therein without departing from the spirit and scope of the present disclosure.

What is claimed is:

1. A display apparatus comprising:

a display panel comprising a plurality of printed circuit board (PCB) input pad units and a plurality of integrated circuit (IC) input pad units;

a printed circuit board comprising a plurality of PCB output pad units and a measurement terminal unit;

a plurality of flexible printed circuit boards, each of the plurality of flexible printed circuit boards having a first end connected to the display panel and a second end connected to the printed circuit board; and a plurality of integrated circuit chips respectively connected to the plurality of IC input pad units, wherein the measurement terminal unit comprises a plurality of measurement terminals arranged adjacent to each other, each of the plurality of integrated circuit chips comprises a plurality of IC output pad groups comprising a plurality of IC output pads, each of the plurality of PCB output pad units comprises a plurality of PCB output pad groups comprising a plurality of PCB output pads electrically connected to the plurality of IC output pads, and at least some of the plurality of PCB output pads electrically connected to the plurality of IC output pads are electrically connected to the plurality of measurement terminals.

2. The display apparatus of claim 1, wherein:

the plurality of PCB output pad units comprises a first PCB output pad unit and a second PCB output pad unit;

in a plan view, the first PCB output pad unit is disposed adjacent to a first side of the display panel, and in the plan view, the second PCB output pad unit is disposed adjacent to a second side facing the first side of the display panel;

the first PCB output pad unit comprises a 1-1 PCB output pad group and a 2-1 PCB output pad group, and the second PCB output pad unit comprises a 1-2 PCB output pad group and a 2-2 PCB output pad group;

in the plan view, the 1-1 PCB output pad group is disposed closer to the first side of the display panel than the 2-1 PCB output pad group, and in the plan view, the 1-2 PCB output pad group is disposed closer to the first side of the display panel than the 2-2 PCB output pad group;

the measurement terminal unit comprises a first measurement terminal group and a second measurement terminal group;

each of the first measurement terminal group and the second measurement terminal group comprises a plurality of measurement terminals arranged adjacent to each other;

PCB output pads of the 1-1 PCB output pad group electrically connected to the IC output pads are electrically connected to a first portion of the plurality of measurement terminals of the first measurement terminal group; and PCB output pads of the 2-2 PCB output pad group electrically connected to the IC output pads are electrically connected to a first portion of the plurality of measurement terminals of the second measurement terminal group.

3. The display apparatus of claim 2, wherein:

PCB output pads of the 2-1 PCB output pad group electrically connected to the IC output pads are electrically connected to a second portion of the plurality of measurement terminals of the first measurement terminal group; and PCB output pads of the 1-2 PCB output pad group electrically connected to the IC output pads are electrically connected to a second portion of the plurality of measurement terminals of the second measurement terminal group.

4. The display apparatus of claim 2, wherein the plurality of PCB output pad units further comprise a third PCB output pad unit disposed between the first PCB output pad unit and the second PCB output pad unit, wherein the third PCB output pad unit comprises a 1-3 PCB output pad group and a 2-3 PCB output pad group, and in the plan view, the 1-3 PCB output pad group is disposed closer to the first side of the display panel than the 2-3 PCB output pad group.

5. The display apparatus of claim 4, wherein:

PCB output pads of the 2-1 PCB output pad group electrically connected to the IC output pads are electrically connected to a second portion of the plurality of measurement terminals of the first measurement terminal group, PCB output pads of the 1-3 PCB output pad group electrically connected to the IC output pads are electrically connected to a third portion of the plurality of measurement terminals of the first measurement terminal group, PCB output pads of the 2-3 PCB output pad group electrically connected to the IC output pads are electrically connected to a third portion of the plurality of measurement terminals of the second measurement terminal group, and PCB output pads of the 1-2 PCB output pad group electrically connected to the IC output pads are electrically connected to a second portion of the plurality of measurement terminals of the second measurement terminal group.

6. The display apparatus of claim 4, wherein the plurality of PCB output pad units further comprise a fourth PCB output pad unit located between the first PCB output pad unit and the third PCB output pad unit, and a fifth PCB output pad unit located between the second PCB output pad unit and the third PCB output pad unit, wherein the fourth PCB output pad unit comprises a 1-4 PCB output pad group and a 2-4 PCB output pad group, the fifth PCB output pad unit comprises a 1-5 PCB output pad group and a 2-5 PCB output pad group, and in the plan view, the 1-4 PCB output pad group is disposed closer to the first side of the display panel than the 2-4 PCB output pad group, and in the plan view, the 1-5 PCB output pad group is disposed closer to the first side of the display panel than the 2-5 PCB output pad group.

7. The display apparatus of claim 6, wherein:

PCB output pads of the 2-4 PCB output pad group electrically connected to the IC output pads are electrically connected to a fourth portion of the plurality of measurement terminals of the first measurement terminal group;

PCB output pads of the 1-3 PCB output pad group electrically connected to the IC output pads are electrically connected to a third portion of the plurality of measurement terminals of the first measurement terminal group;

PCB output pads of the 2-3 PCB output pad group electrically connected to the IC output pads are electrically connected to a third portion of the plurality of measurement terminals of the second measurement terminal group; and PCB output pads of the 1-5 PCB output pad group electrically connected to the IC output pads are electrically connected to a fifth portion of the plurality of measurement terminals of the second measurement terminal group.

8. The display apparatus of claim 7, wherein:

PCB output pads of the 2-1 PCB output pad group electrically connected to the IC output pads are not electrically connected to the plurality of measurement terminals of the measurement terminal unit;

PCB output pads of the 1-4 PCB output pad group electrically connected to the IC output pads are not electrically connected to the plurality of measurement terminals of the measurement terminal unit;

PCB output pads of the 2-5 PCB output pad group electrically connected to the IC output pads are not electrically connected to the plurality of measurement terminals of the measurement terminal unit; and PCB output pads of the 1-2 PCB output pad group electrically connected to the IC output pads are not electrically connected to the plurality of measurement terminals of the measurement terminal unit.

9. The display apparatus of claim 4, wherein the third PCB output pad unit comprises a 3-1 PCB output pad unit disposed adjacent to the first PCB output pad unit and a 3-2 PCB output pad unit disposed adjacent to the second PCB output pad unit, wherein the 3-1 PCB output pad unit comprises a 1-3-1 PCB output pad group and a 2-3-1 PCB output pad group, the 3-2 PCB output pad unit comprises a 1-3-2 PCB output pad group and a 2-3-2 PCB output pad group, and in the plan view, the 1-3-1 PCB output pad group is disposed closer to the first side of the display panel than the 2-3-1 PCB output pad group, and in the plan view, the 1-3-2 PCB output pad group is disposed closer to the first side of the display panel than the 2-3-2 PCB output pad group.

10. The display apparatus of claim 9, wherein:

PCB output pads of the 1-3-1 PCB output pad group electrically connected to the IC output pads are electrically connected to a third portion of the plurality of measurement terminals of the first measurement terminal group; and PCB output pads of the 2-3-2 PCB output pad group electrically connected to the IC output pads are electrically connected to a third portion of the plurality of measurement terminals of the second measurement terminal group.

11. The display apparatus of claim 10, wherein:

PCB output pads of the 2-3-1 PCB output pad group electrically connected to the IC output pads are not electrically connected to the plurality of measurement terminals of the measurement terminal unit; and PCB output pads of the 1-3-2 PCB output pad group electrically connected to the IC output pads are not electrically connected to the plurality of measurement terminals of the measurement terminal unit.

12. The display apparatus of claim 10, wherein the plurality of PCB output pad units further comprise a fourth PCB output pad unit disposed between the first PCB output pad unit and the third PCB output pad unit, and a fifth PCB output pad unit disposed between the second PCB output pad unit and the third PCB output pad unit, wherein the fourth PCB output pad unit comprises a 1-4 PCB output pad group and a 2-4 PCB output pad group, the fifth PCB output pad unit comprises a 1-5 PCB output pad group and a 2-5 PCB output pad group, and in the plan view, the 1-4 PCB output pad group is disposed closer to the first side of the display panel than the 2-4 PCB output pad group, and in the plan view, the 1-5 PCB output pad group is disposed closer to the first side of the display panel than the 2-5 PCB output pad group.

13. The display apparatus of claim 12, wherein:

PCB output pads of the 2-4 PCB output pad group electrically connected to the IC output pads are electrically connected to a fourth portion of the plurality of measurement terminals of the first measurement terminal group;

and

PCB output pads of the 1-5 PCB output pad group electrically connected to the IC output pads are electrically connected to a fifth portion of the plurality of measurement terminals of the second measurement terminal group.

14. The display apparatus of claim 13, wherein:

PCB output pads of the 2-1 PCB output pad group electrically connected to the IC output pads are not electrically connected to the plurality of measurement terminals of the measurement terminal unit;

PCB output pads of the 1-4 PCB output pad group electrically connected to the IC output pads are not electrically connected to the plurality of measurement terminals of the measurement terminal unit;

PCB output pads of the 2-3-1 PCB output pad group electrically connected to the IC output pads are not electrically connected to the plurality of measurement terminals of the measurement terminal unit;

PCB output pads of the 1-3-2 PCB output pad group electrically connected to the IC output pads are not electrically connected to the plurality of measurement terminals of the measurement terminal unit;

PCB output pads of the 2-5 PCB output pad group electrically connected to the IC output pads are not electrically connected to the plurality of measurement terminals of the measurement terminal unit; and PCB output pads of the 1-2 PCB output pad group electrically connected to the IC output pads are not electrically connected to the plurality of measurement terminals of the measurement terminal unit.

15. The display apparatus of claim 1, wherein:

each of the plurality of IC input pad units comprises a plurality of IC input pad groups comprising a plurality of IC input pads;

each of the plurality of PCB input pad units comprises a plurality of PCB input pad groups comprising a plurality of PCB input pads;

each of the plurality of IC output pad groups comprises a first IC output pad, a second IC output pad, and a fourth IC output pad connected to each other, each of the plurality of IC input pad groups comprises a first IC input pad electrically connected to the first IC output pad, a second IC input pad electrically connected to the second IC output pad, and a fourth IC input pad electrically connected to the fourth IC output pad, each of the plurality of PCB input pad groups comprises a first PCB input pad connected to the first IC input pad, a second PCB input pad connected to the second IC input pad, a third PCB input pad connected to the second IC input pad, and a fourth PCB input pad connected to the fourth IC input pad, and each of the plurality of PCB output pad groups comprises a first PCB output pad electrically connected to the first PCB input pad, a second PCB output pad electrically connected to the second PCB input pad, a third PCB output pad electrically connected to the third PCB input pad, and a fourth PCB output pad electrically connected to the fourth PCB input pad.

16. The display apparatus of claim 15, wherein:

the first PCB output pad is connected to a first connection terminal;

the second PCB output pad is connected to a second connection terminal;

the third PCB output pad is connected to a third connection terminal; and the fourth PCB output pad is connected to a fourth connection terminal.

17. The display apparatus of claim 15, wherein each of the plurality of flexible printed circuit boards comprises a first upper transmission pad electrically connected to the first PCB input pad, a second upper transmission pad electrically connected to the second PCB input pad, a third upper transmission pad electrically connected to the third PCB input pad, a fourth upper transmission pad electrically connected to the fourth PCB input pad, a first lower transmission pad electrically connected to the first PCB output pad, a second lower transmission pad electrically connected to the second PCB output pad, a third lower transmission pad electrically connected to the third PCB output pad, and a fourth lower transmission pad electrically connected to the fourth PCB output pad, wherein the first upper transmission pad is connected to the first lower transmission pad, the second upper transmission pad is connected to the second lower transmission pad, the third upper transmission pad is connected to the third lower transmission pad, and the fourth upper transmission pad is connected to the fourth lower transmission pad.

18. The display apparatus of claim 1, wherein:

each of the plurality of PCB input pad groups further comprises a fifth PCB input pad and a sixth PCB input pad connected to each other; and each of the plurality of PCB output pad groups further comprises a fifth PCB output pad connected to the fifth PCB input pad and a sixth PCB output pad connected to the sixth PCB input pad.

19. The display apparatus of claim 18, wherein:

the fifth PCB output pad of one PCB output pad group is connected to one connection terminal or the sixth PCB output pad of an adjacent PCB output pad group;

the sixth PCB output pad of one PCB output pad group is connected to one connection terminal or the fifth PCB output pad of an adjacent PCB output pad group;

the one connection terminal connected to the fifth PCB output pad is electrically connected to some of the plurality of measurement terminals; and the one connection terminal connected to the sixth PCB output pad is electrically connected to some of the plurality of measurement terminals.

20. The display apparatus of claim 18, wherein each of the plurality of flexible printed circuit boards comprises a fifth upper transmission pad electrically connected to the fifth PCB input pad, a sixth upper transmission pad electrically connected to the sixth PCB input pad, a fifth lower transmission pad electrically connected to the fifth PCB output pad, and a sixth lower transmission pad electrically connected to the sixth PCB output pad, wherein the fifth upper transmission pad is connected to the fifth lower transmission pad, and the sixth upper transmission pad is connected to the sixth lower transmission pad.

21. A display apparatus comprising:

a display panel comprising at least one printed circuit board (PCB) input pad unit and at least one integrated circuit (IC) input pad unit including a plurality of IC input pads;

a printed circuit board comprising a plurality of PCB output pad units and a measurement terminal unit;

at least one flexible printed circuit board directly connected to the display panel and the printed circuit board; and at least one integrated circuit chip respectively connected to the at least one IC input pad unit, wherein the measurement terminal unit comprises a plurality of measurement terminals arranged adjacent to each other, the at least one integrated circuit chip comprises a plurality of IC output pad groups comprising a plurality of IC output pads, each of the plurality of PCB output pad units comprises a plurality of PCB output pad groups comprising a plurality of PCB output pads electrically connected to the plurality of IC output pads, a first portion of the plurality of PCB output pads electrically connected to the plurality of IC output pads are electrically connected to the plurality of measurement terminals, and a second portion of the plurality of PCB output pads electrically connected to the plurality of IC output pads are not electrically connected to the plurality of measurement terminals.

22. The display apparatus of claim 21, wherein the measurement terminal unit measures connection resistance between the plurality of IC input pads and the plurality of IC output pads using a 4-terminal resistance measurement method.

23. The display apparatus of claim 21, wherein the second portion of the plurality of PCB output pads are disposed in a central portion of the display panel.

24. An electronic apparatus including the display apparatus of claim 1.

* * * * *